(12) United States Patent
Andrews et al.

(10) Patent No.: US 7,362,115 B2
(45) Date of Patent: *Apr. 22, 2008

(54) CHUCK WITH INTEGRATED WAFER SUPPORT

(75) Inventors: Peter Andrews, Beaverton, OR (US); Brad Froemke, Portland, OR (US); John Dunklee, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/655,605

(22) Filed: Jan. 19, 2007

(65) Prior Publication Data

US 2007/0115013 A1    May 24, 2007

Related U.S. Application Data

(63) Continuation of application No. 10/927,247, filed on Aug. 26, 2004, now Pat. No. 7,187,188.

(60) Provisional application No. 60/532,757, filed on Dec. 24, 2003.

(51) Int. Cl.
*G01R 31/02* (2006.01)
(52) U.S. Cl. ............................................. 324/755
(58) Field of Classification Search ................ None
See application file for complete search history.

(56) References Cited

U.S. PATENT DOCUMENTS

| | | |
|---|---|---|
| 1,337,866 A | 4/1920 | Whitaker |
| 2,142,625 A | 1/1939 | Zoethout |
| 2,197,081 A | 4/1940 | Piron |
| 2,376,101 A | 5/1945 | Tyzzer |
| 2,389,668 A | 11/1945 | Johnson |
| 2,471,897 A | 5/1949 | Rappl |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |

(Continued)

FOREIGN PATENT DOCUMENTS

CN    1083975    3/1994

(Continued)

OTHER PUBLICATIONS

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

(Continued)

*Primary Examiner*—Jermele Hollington
(74) *Attorney, Agent, or Firm*—Chernoff, Vilhauer, McClung & Stenzel

(57) ABSTRACT

An improved chuck assembly with lift pins. The chuck assembly may have an outer periphery and an upper surface. The lift pins may be positioned within the periphery of the chuck assembly and may be capable of relative vertical movement with respect to the upper surface of the chuck assembly.

19 Claims, 16 Drawing Sheets

U.S. PATENT DOCUMENTS

| | | |
|---|---|---|
| 3,230,299 A | 1/1966 | Radziejowski |
| 3,258,484 A | 6/1966 | Terry |
| 3,265,969 A | 8/1966 | Catu |
| 3,289,046 A | 11/1966 | Carr |
| 3,333,274 A | 7/1967 | Forcier |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,568,228 A | 7/1971 | Reed, Jr. et al. |
| 3,602,845 A | 8/1971 | Agrios et al. |
| 3,609,539 A | 9/1971 | Gunthert |
| 3,648,169 A | 3/1972 | Wiesler |
| 3,654,573 A | 4/1972 | Graham |
| 3,662,318 A | 5/1972 | Decuyper |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,888 A | 6/1974 | Bowers et al. |
| 3,829,076 A | 8/1974 | Sofy |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,742,571 A | 5/1988 | Letron |
| 4,744,041 A | 5/1988 | Strunk et al. |
| 4,746,857 A | 5/1988 | Sakai et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,766,384 A | 8/1988 | Kleinberg et al. |
| 4,771,234 A | 9/1988 | Cook et al. |
| 4,772,846 A | 9/1988 | Reeds |
| 4,777,434 A | 10/1988 | Miller et al. |
| 4,780,670 A | 10/1988 | Cherry |
| 4,783,625 A | 11/1988 | Harry et al. |
| 4,784,213 A | 11/1988 | Eager et al. |
| 4,786,867 A | 11/1988 | Yamatsu |

| | | | | | | |
|---|---|---|---|---|---|---|
| 4,787,752 A | 11/1988 | Fraser et al. | | 5,103,169 A | 4/1992 | Heaton et al. |
| 4,791,363 A | 12/1988 | Logan | | 5,105,148 A | 4/1992 | Lee |
| 4,795,962 A | 1/1989 | Yanagawa et al. | | 5,105,181 A | 4/1992 | Ross |
| 4,805,627 A | 2/1989 | Klingenbeck et al. | | 5,107,076 A | 4/1992 | Bullock et al. |
| 4,810,981 A | 3/1989 | Herstein | | 5,136,237 A | 8/1992 | Smith et al. |
| 4,812,754 A | 3/1989 | Tracy et al. | | 5,142,224 A | 8/1992 | Smith et al. |
| 4,816,767 A | 3/1989 | Cannon et al. | | 5,144,228 A | 9/1992 | Sorna et al. |
| 4,818,169 A | 4/1989 | Schram et al. | | 5,159,264 A | 10/1992 | Anderson |
| 4,827,211 A | 5/1989 | Strid et al. | | 5,159,267 A | 10/1992 | Anderson |
| 4,831,494 A | 5/1989 | Arnold et al. | | 5,159,752 A | 11/1992 | Mahant-Shetti et al. |
| 4,838,802 A | 6/1989 | Soar | | 5,160,883 A | 11/1992 | Blanz |
| 4,839,587 A | 6/1989 | Flatley et al. | | 5,164,319 A | 11/1992 | Hafeman et al. |
| 4,845,426 A | 7/1989 | Nolan et al. | | 5,164,661 A | 11/1992 | Jones |
| 4,849,689 A | 7/1989 | Gleason | | 5,166,606 A | 11/1992 | Blanz |
| 4,853,613 A | 8/1989 | Sequeira et al. | | 5,172,049 A | 12/1992 | Kiyokawa et al. |
| 4,853,624 A | 8/1989 | Rabjohn | | 5,172,051 A | 12/1992 | Zamborelli |
| 4,853,627 A | 8/1989 | Gleason et al. | | 5,187,443 A | 2/1993 | Bereskin |
| 4,856,426 A | 8/1989 | Wirz | | 5,198,752 A | 3/1993 | Miyata et al. |
| 4,856,904 A | 8/1989 | Akagawa | | 5,198,753 A | 3/1993 | Hamburgen |
| 4,858,160 A | 8/1989 | Strid et al. | | 5,198,756 A | 3/1993 | Jenkins et al. |
| 4,859,989 A | 8/1989 | McPherson | | 5,198,758 A | 3/1993 | Iknaian et al. |
| 4,864,227 A | 9/1989 | Sato | | 5,202,558 A | 4/1993 | Barker |
| 4,871,883 A | 10/1989 | Guiol | | 5,209,088 A | 5/1993 | Vaks |
| 4,871,965 A | 10/1989 | Elbert et al. | | 5,210,485 A | 5/1993 | Kreiger et al. |
| 4,884,026 A | 11/1989 | Hayakawa et al. | | 5,214,243 A | 5/1993 | Johnson |
| 4,884,206 A | 11/1989 | Mate | | 5,214,374 A | 5/1993 | St. Onge |
| 4,888,550 A | 12/1989 | Reid | | 5,218,185 A | 6/1993 | Gross |
| 4,891,584 A | 1/1990 | Kamieniecki et al. | | 5,220,277 A | 6/1993 | Reitinger |
| 4,893,914 A | 1/1990 | Hancock et al. | | 5,221,905 A | 6/1993 | Bhangu et al. |
| 4,894,612 A | 1/1990 | Drake et al. | | 5,225,037 A | 7/1993 | Elder et al. |
| 4,896,109 A | 1/1990 | Rauscher | | 5,225,796 A | 7/1993 | Williams et al. |
| 4,899,998 A | 2/1990 | Teramachi | | 5,227,730 A | 7/1993 | King et al. |
| 4,904,933 A | 2/1990 | Snyder et al. | | 5,232,789 A | 8/1993 | Platz et al. |
| 4,904,935 A | 2/1990 | Calma et al. | | 5,233,197 A | 8/1993 | Bowman et al. |
| 4,906,920 A | 3/1990 | Huff et al. | | 5,233,306 A | 8/1993 | Misra |
| 4,916,398 A | 4/1990 | Rath | | 5,237,267 A | 8/1993 | Harwood et al. |
| 4,918,279 A | 4/1990 | Babel et al. | | 5,245,292 A | 9/1993 | Milesky et al. |
| 4,918,374 A | 4/1990 | Stewart et al. | | 5,266,889 A | 11/1993 | Harwood et al. |
| 4,918,383 A | 4/1990 | Huff et al. | | 5,267,088 A | 11/1993 | Nomura |
| 4,922,128 A | 5/1990 | Dhong et al. | | 5,270,664 A | 12/1993 | McMurtry et al. |
| 4,922,186 A | 5/1990 | Tsuchiya et al. | | 5,274,336 A | 12/1993 | Crook et al. |
| 4,923,407 A | 5/1990 | Rice et al. | | 5,278,494 A | 1/1994 | Obigane |
| 4,926,118 A | 5/1990 | O'Connor et al. | | 5,280,156 A | 1/1994 | Niori et al. |
| 4,929,893 A | 5/1990 | Sato et al. | | 5,298,972 A | 3/1994 | Heffner |
| 4,933,634 A | 6/1990 | Cuzin et al. | | 5,303,938 A | 4/1994 | Miller et al. |
| 4,968,931 A | 11/1990 | Littlebury et al. | | 5,304,924 A | 4/1994 | Yamano et al. |
| 4,978,907 A | 12/1990 | Smith | | 5,315,237 A | 5/1994 | Iwakura et al. |
| 4,978,914 A | 12/1990 | Akimoto et al. | | 5,321,352 A | 6/1994 | Takebuchi |
| 4,982,153 A | 1/1991 | Collins et al. | | 5,321,453 A | 6/1994 | Mori et al. |
| 4,994,737 A | 2/1991 | Carlton et al. | | 5,325,052 A | 6/1994 | Yamashita |
| 5,001,423 A | 3/1991 | Abrami et al. | | 5,334,931 A | 8/1994 | Clarke et al. |
| 5,006,796 A | 4/1991 | Burton et al. | | 5,336,989 A | 8/1994 | Hofer |
| 5,010,296 A | 4/1991 | Okada et al. | | 5,345,170 A * | 9/1994 | Schwindt et al. ........... 324/754 |
| 5,019,692 A | 5/1991 | Nbedi et al. | | 5,357,211 A | 10/1994 | Bryson et al. |
| 5,030,907 A | 7/1991 | Yih et al. | | 5,363,050 A | 11/1994 | Guo et al. |
| 5,034,688 A | 7/1991 | Moulene et al. | | 5,369,368 A | 11/1994 | Kassen et al. |
| 5,041,782 A | 8/1991 | Marzan | | 5,369,370 A | 11/1994 | Stratmann et al. |
| 5,045,781 A | 9/1991 | Gleason et al. | | 5,371,457 A | 12/1994 | Lipp |
| 5,061,823 A | 10/1991 | Carroll | | 5,373,231 A | 12/1994 | Boll et al. |
| 5,065,089 A | 11/1991 | Rich | | 5,374,938 A | 12/1994 | Hatazawa et al. |
| 5,065,092 A | 11/1991 | Sigler | | 5,376,790 A | 12/1994 | Linker et al. |
| 5,066,357 A | 11/1991 | Smyth, Jr. et al. | | 5,382,898 A | 1/1995 | Subramanian |
| 5,070,297 A | 12/1991 | Kwon et al. | | 5,397,855 A | 3/1995 | Ferlier |
| 5,077,523 A | 12/1991 | Blanz | | 5,404,111 A | 4/1995 | Mori et al. |
| 5,082,627 A | 1/1992 | Stanbro | | 5,408,188 A | 4/1995 | Katoh |
| 5,084,671 A | 1/1992 | Miyata et al. | | 5,408,189 A | 4/1995 | Swart et al. |
| 5,089,774 A | 2/1992 | Nakano | | 5,410,259 A | 4/1995 | Fujihara et al. |
| 5,091,691 A | 2/1992 | Kamieniecki et al. | | 5,412,330 A | 5/1995 | Ravel et al. |
| 5,091,732 A | 2/1992 | Mileski et al. | | 5,412,866 A | 5/1995 | Woith et al. |
| 5,095,891 A | 3/1992 | Reitter | | 5,414,565 A | 5/1995 | Sullivan et al. |
| 5,097,207 A | 3/1992 | Blanz | | 5,422,574 A | 6/1995 | Kister |
| 5,101,149 A | 3/1992 | Adams et al. | | 5,434,512 A * | 7/1995 | Schwindt et al. ........... 324/754 |
| 5,101,453 A | 3/1992 | Rumbaugh | | 5,448,172 A | 9/1995 | Dechene et al. |

| Patent No. | Date | Inventor |
|---|---|---|
| 5,451,884 A | 9/1995 | Sauerland |
| 5,457,398 A * | 10/1995 | Schwindt et al. ............ 324/754 |
| 5,461,328 A | 10/1995 | Devereaux et al. |
| 5,467,024 A | 11/1995 | Swapp |
| 5,469,324 A | 11/1995 | Henderson et al. |
| 5,475,316 A | 12/1995 | Hurley et al. |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,486,975 A | 1/1996 | Shamouilian et al. |
| 5,488,954 A | 2/1996 | Sleva et al. |
| 5,491,426 A | 2/1996 | Small |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,508,631 A | 4/1996 | Manku et al. |
| 5,510,792 A | 4/1996 | Ono et al. |
| 5,511,010 A | 4/1996 | Burns |
| 5,512,835 A | 4/1996 | Rivera et al. |
| 5,515,167 A | 5/1996 | Ledger et al. |
| 5,517,111 A | 5/1996 | Shelor |
| 5,521,522 A | 5/1996 | Abe et al. |
| 5,523,694 A | 6/1996 | Cole, Jr. |
| 5,528,158 A | 6/1996 | Sinsheimer et al. |
| 5,530,371 A | 6/1996 | Perry et al. |
| 5,530,372 A | 6/1996 | Lee et al. |
| 5,532,609 A * | 7/1996 | Harwood et al. ............ 324/754 |
| 5,539,323 A | 7/1996 | Davis, Jr. |
| 5,539,676 A | 7/1996 | Yamaguchi |
| 5,546,012 A | 8/1996 | Perry et al. |
| 5,550,480 A | 8/1996 | Nelson et al. |
| 5,550,482 A | 8/1996 | Sano |
| 5,552,716 A | 9/1996 | Takahashi et al. |
| 5,561,377 A | 10/1996 | Strid et al. |
| 5,561,585 A | 10/1996 | Barnes et al. |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,572,398 A | 11/1996 | Federlin et al. |
| 5,578,932 A | 11/1996 | Adamian |
| 5,583,445 A | 12/1996 | Mullen |
| 5,584,608 A | 12/1996 | Gillespie |
| 5,594,358 A | 1/1997 | Ishikawa et al. |
| 5,600,256 A | 2/1997 | Woith et al. |
| 5,604,444 A * | 2/1997 | Harwood et al. ............ 324/754 |
| 5,610,529 A | 3/1997 | Schwindt |
| 5,611,946 A | 3/1997 | Leong et al. |
| 5,617,035 A | 4/1997 | Swapp |
| 5,628,057 A | 5/1997 | Phillips et al. |
| 5,629,631 A | 5/1997 | Perry et al. |
| 5,631,571 A | 5/1997 | Spaziani et al. |
| 5,633,780 A | 5/1997 | Cronin |
| 5,640,101 A | 6/1997 | Kuji et al. |
| 5,642,298 A | 6/1997 | Mallory et al. |
| 5,644,248 A | 7/1997 | Fujimoto |
| 5,646,538 A | 7/1997 | Lide et al. |
| 5,653,939 A | 8/1997 | Hollis et al. |
| 5,656,942 A | 8/1997 | Watts et al. |
| 5,657,394 A | 8/1997 | Schwartz et al. |
| 5,659,255 A | 8/1997 | Strid et al. |
| 5,659,421 A | 8/1997 | Rahmel et al. |
| 5,663,653 A * | 9/1997 | Schwindt et al. ............ 324/754 |
| 5,666,063 A | 9/1997 | Abercrombie et al. |
| 5,668,470 A | 9/1997 | Shelor |
| 5,669,316 A | 9/1997 | Faz et al. |
| 5,670,322 A | 9/1997 | Eggers et al. |
| 5,670,888 A | 9/1997 | Cheng |
| 5,672,816 A | 9/1997 | Park et al. |
| 5,675,499 A | 10/1997 | Lee et al. |
| 5,675,932 A | 10/1997 | Mauney |
| 5,676,360 A | 10/1997 | Boucher et al. |
| 5,680,039 A | 10/1997 | Mochizuki et al. |
| 5,682,337 A | 10/1997 | El-Fishawy et al. |
| 5,685,232 A | 11/1997 | Inoue |
| 5,704,355 A | 1/1998 | Bridges |
| 5,712,571 A | 1/1998 | O'Donoghue |
| 5,715,819 A | 2/1998 | Svenson et al. |
| 5,729,150 A | 3/1998 | Schwindt |
| 5,731,708 A | 3/1998 | Sobhani |
| 5,731,920 A | 3/1998 | Katsuragawa |
| 5,744,971 A | 4/1998 | Chan et al. |
| 5,748,506 A | 5/1998 | Bockelman |
| 5,751,252 A | 5/1998 | Phillips |
| 5,767,690 A | 6/1998 | Fujimoto |
| 5,773,951 A | 6/1998 | Markowski et al. |
| 5,777,485 A | 7/1998 | Tanaka et al. |
| 5,792,668 A | 8/1998 | Fuller et al. |
| 5,793,213 A | 8/1998 | Bockelman et al. |
| 5,794,133 A | 8/1998 | Kashima |
| 5,798,652 A | 8/1998 | Taraci |
| 5,802,856 A | 9/1998 | Schaper et al. |
| 5,804,982 A | 9/1998 | Lo et al. |
| 5,804,983 A | 9/1998 | Nakajima et al. |
| 5,807,107 A | 9/1998 | Bright et al. |
| 5,811,751 A | 9/1998 | Leong et al. |
| 5,824,494 A | 10/1998 | Feldberg |
| 5,828,225 A | 10/1998 | Obikane et al. |
| 5,829,437 A | 11/1998 | Bridges |
| 5,831,442 A | 11/1998 | Heigl |
| 5,833,601 A | 11/1998 | Swartz et al. |
| 5,835,997 A | 11/1998 | Yassine |
| 5,838,161 A | 11/1998 | Akram et al. |
| 5,841,288 A | 11/1998 | Meaney et al. |
| 5,846,708 A | 12/1998 | Hollis et al. |
| 5,847,569 A | 12/1998 | Ho et al. |
| 5,848,500 A | 12/1998 | Kirk |
| 5,852,232 A | 12/1998 | Samsavar et al. |
| 5,854,608 A | 12/1998 | Leisten |
| 5,857,667 A | 1/1999 | Lee |
| 5,861,743 A | 1/1999 | Pye et al. |
| 5,867,073 A | 2/1999 | Weinreb et al. |
| 5,869,326 A | 2/1999 | Hofmann |
| 5,869,975 A | 2/1999 | Strid et al. |
| 5,874,361 A | 2/1999 | Collins et al. |
| 5,879,289 A | 3/1999 | Yarush et al. |
| 5,883,522 A | 3/1999 | O'Boyle |
| 5,883,523 A | 3/1999 | Ferland et al. |
| 5,888,075 A | 3/1999 | Hasegawa et al. |
| 5,892,539 A | 4/1999 | Colvin |
| 5,900,737 A | 5/1999 | Graham et al. |
| 5,903,143 A | 5/1999 | Mochizuki et al. |
| 5,905,421 A | 5/1999 | Oldfield |
| 5,910,727 A | 6/1999 | Fujihara et al. |
| 5,916,689 A | 6/1999 | Collins et al. |
| 5,923,177 A | 7/1999 | Wardwell |
| 5,926,028 A | 7/1999 | Mochizuki |
| 5,942,907 A | 8/1999 | Chiang |
| 5,944,093 A | 8/1999 | Viswanath |
| 5,945,836 A | 8/1999 | Sayre et al. |
| 5,949,579 A | 9/1999 | Baker |
| 5,952,842 A | 9/1999 | Fujimoto |
| 5,959,461 A | 9/1999 | Brown et al. |
| 5,960,411 A | 9/1999 | Hartman et al. |
| 5,963,027 A | 10/1999 | Peters |
| 5,963,364 A | 10/1999 | Leong et al. |
| 5,970,429 A | 10/1999 | Martin |
| 5,973,505 A | 10/1999 | Strid et al. |
| 5,974,662 A | 11/1999 | Eldridge et al. |
| 5,981,268 A | 11/1999 | Kovacs et al. |

| | | | |
|---|---|---|---|
| 5,982,166 A | 11/1999 | Mautz | |
| 5,993,611 A | 11/1999 | Moroney, III et al. | |
| 5,995,914 A | 11/1999 | Cabot | |
| 5,996,102 A | 11/1999 | Haulin | |
| 5,998,768 A | 12/1999 | Hunter et al. | |
| 5,999,268 A | 12/1999 | Yonezawa et al. | |
| 6,001,760 A | 12/1999 | Katsuda et al. | |
| 6,002,236 A | 12/1999 | Trant et al. | |
| 6,002,263 A | 12/1999 | Peters et al. | |
| 6,002,426 A | 12/1999 | Back et al. | |
| 6,013,586 A | 1/2000 | McGhee et al. | |
| 6,019,612 A | 2/2000 | Hasegawa et al. | |
| 6,023,209 A | 2/2000 | Faulkner et al. | |
| 6,028,435 A | 2/2000 | Nikawa | |
| 6,029,141 A | 2/2000 | Bezos et al. | |
| 6,031,383 A | 2/2000 | Streib et al. | |
| 6,032,714 A | 3/2000 | Fenton | |
| 6,034,533 A | 3/2000 | Tervo et al. | |
| 6,037,785 A | 3/2000 | Higgins | |
| 6,037,793 A | 3/2000 | Miyazawa et al. | |
| 6,043,667 A | 3/2000 | Cadwallader et al. | |
| 6,049,216 A | 4/2000 | Yang et al. | |
| 6,051,422 A | 4/2000 | Kovacs et al. | |
| 6,052,653 A | 4/2000 | Mazur et al. | |
| 6,054,869 A | 4/2000 | Hutton et al. | |
| 6,060,888 A | 5/2000 | Blackham et al. | |
| 6,060,891 A | 5/2000 | Hembree et al. | |
| 6,060,892 A | 5/2000 | Yamagata | |
| 6,061,589 A | 5/2000 | Bridges et al. | |
| 6,064,213 A | 5/2000 | Khandros et al. | |
| 6,064,217 A | 5/2000 | Smith | |
| 6,064,218 A | 5/2000 | Godfrey et al. | |
| 6,066,911 A | 5/2000 | Lindemann et al. | |
| 6,078,183 A | 6/2000 | Cole, Jr. | |
| 6,091,236 A | 7/2000 | Piety et al. | |
| 6,091,255 A | 7/2000 | Godfrey | |
| 6,096,567 A | 8/2000 | Kaplan et al. | |
| 6,100,815 A | 8/2000 | Pailthorp | |
| 6,104,203 A | 8/2000 | Costello et al. | |
| 6,104,206 A | 8/2000 | Verkuil | |
| 6,111,419 A | 8/2000 | Lefever et al. | |
| 6,114,865 A | 9/2000 | Lagowski et al. | |
| 6,118,287 A | 9/2000 | Boll et al. | |
| 6,118,894 A | 9/2000 | Schwartz et al. | |
| 6,121,783 A | 9/2000 | Horner et al. | |
| 6,124,723 A | 9/2000 | Costello | |
| 6,124,725 A | 9/2000 | Sato | |
| 6,127,831 A | 10/2000 | Khoury et al. | |
| 6,130,544 A | 10/2000 | Strid et al. | |
| 6,137,302 A | 10/2000 | Schwindt | |
| 6,137,303 A | 10/2000 | Deckert et al. | |
| 6,144,212 A | 11/2000 | Mizuta | |
| 6,147,502 A | 11/2000 | Fryer et al. | |
| 6,147,851 A | 11/2000 | Anderson | |
| 6,160,407 A | 12/2000 | Nikawa | |
| 6,166,553 A | 12/2000 | Sinsheimer | |
| 6,169,410 B1 | 1/2001 | Grace et al. | |
| 6,172,337 B1 | 1/2001 | Johnsgard et al. | |
| 6,175,228 B1 | 1/2001 | Zamborelli et al. | |
| 6,181,144 B1 | 1/2001 | Hembree et al. | |
| 6,181,149 B1 | 1/2001 | Godfrey et al. | |
| 6,181,297 B1 | 1/2001 | Leisten | |
| 6,181,416 B1 | 1/2001 | Falk | |
| 6,184,845 B1 | 2/2001 | Leisten et al. | |
| 6,191,596 B1 | 2/2001 | Abiko | |
| 6,194,720 B1 | 2/2001 | Li et al. | |
| 6,194,907 B1 | 2/2001 | Kanao et al. | |
| 6,198,299 B1 | 3/2001 | Hollman | |
| 6,211,663 B1 | 4/2001 | Moulthrop et al. | |
| 6,211,837 B1 | 4/2001 | Crouch et al. | |
| 6,215,295 B1 | 4/2001 | Smith, III | |
| 6,222,031 B1 | 4/2001 | Wakabayashi et al. | |
| 6,222,970 B1 | 4/2001 | Wach et al. | |
| 6,229,327 B1 | 5/2001 | Boll et al. | |
| 6,232,787 B1 | 5/2001 | Lo et al. | |
| 6,232,788 B1 * | 5/2001 | Schwindt et al. | 324/754 |
| 6,232,789 B1 | 5/2001 | Schwindt | |
| 6,232,790 B1 | 5/2001 | Bryan et al. | |
| 6,233,613 B1 | 5/2001 | Walker et al. | |
| 6,236,223 B1 | 5/2001 | Brady et al. | |
| 6,236,975 B1 | 5/2001 | Boe et al. | |
| 6,236,977 B1 | 5/2001 | Verba et al. | |
| 6,242,929 B1 | 6/2001 | Mizuta | |
| 6,245,692 B1 | 6/2001 | Pearce et al. | |
| 6,251,595 B1 | 6/2001 | Gordon et al. | |
| 6,252,392 B1 | 6/2001 | Peters | |
| 6,257,319 B1 | 7/2001 | Kainuma et al. | |
| 6,257,564 B1 | 7/2001 | Avneri et al. | |
| 6,259,261 B1 | 7/2001 | Engelking et al. | |
| 6,265,950 B1 | 7/2001 | Schmidt et al. | |
| 6,271,673 B1 | 8/2001 | Furuta et al. | |
| 6,275,738 B1 | 8/2001 | Kasevich et al. | |
| 6,278,051 B1 | 8/2001 | Peabody | |
| 6,278,411 B1 | 8/2001 | Ohlsson et al. | |
| 6,281,691 B1 | 8/2001 | Matsunaga et al. | |
| 6,284,971 B1 | 9/2001 | Atalar et al. | |
| 6,288,557 B1 | 9/2001 | Peters et al. | |
| 6,292,760 B1 | 9/2001 | Burns | |
| 6,300,775 B1 | 10/2001 | Peach et al. | |
| 6,307,672 B1 | 10/2001 | DeNure | |
| 6,310,483 B1 | 10/2001 | Taura et al. | |
| 6,310,755 B1 | 10/2001 | Kholodenko et al. | |
| 6,313,649 B2 * | 11/2001 | Harwood et al. | 324/754 |
| 6,320,372 B1 | 11/2001 | Keller | |
| 6,320,396 B1 | 11/2001 | Nikawa | |
| 6,327,034 B1 | 12/2001 | Hoover et al. | |
| 6,335,625 B1 | 1/2002 | Bryant et al. | |
| 6,335,628 B2 * | 1/2002 | Schwindt et al. | 324/754 |
| 6,340,568 B2 | 1/2002 | Hefti | |
| 6,340,895 B1 | 1/2002 | Uher et al. | |
| 6,359,456 B1 | 3/2002 | Hembree et al. | |
| 6,362,636 B1 | 3/2002 | Peters et al. | |
| 6,362,792 B1 | 3/2002 | Sawamura et al. | |
| 6,366,247 B1 | 4/2002 | Sawamura et al. | |
| 6,369,776 B1 | 4/2002 | Leisten et al. | |
| 6,376,258 B2 | 4/2002 | Hefti | |
| 6,380,751 B2 | 4/2002 | Harwood et al. | |
| 6,384,614 B1 | 5/2002 | Hager et al. | |
| 6,395,480 B1 | 5/2002 | Hefti | |
| 6,396,296 B1 | 5/2002 | Tarter et al. | |
| 6,396,298 B1 | 5/2002 | Young et al. | |
| 6,400,168 B2 | 6/2002 | Matsunaga et al. | |
| 6,404,213 B2 | 6/2002 | Noda | |
| 6,407,560 B1 | 6/2002 | Walraven et al. | |
| 6,407,562 B1 | 6/2002 | Whiteman | |
| 6,409,724 B1 | 6/2002 | Penny et al. | |
| 6,414,478 B1 | 7/2002 | Suzuki | |
| 6,415,858 B1 | 7/2002 | Getchel et al. | |
| 6,418,009 B1 | 7/2002 | Brunette | |
| 6,420,722 B2 | 7/2002 | Moore et al. | |
| 6,424,141 B1 | 7/2002 | Hollman et al. | |
| 6,424,316 B1 | 7/2002 | Leisten et al. | |
| 6,445,202 B1 * | 9/2002 | Cowan et al. | 324/760 |
| 6,447,339 B1 | 9/2002 | Reed et al. | |
| 6,448,788 B1 | 9/2002 | Meaney et al. | |
| 6,459,739 B1 | 10/2002 | Vitenberg | |
| 6,468,816 B2 * | 10/2002 | Hunter | 324/765 |
| 6,476,442 B1 | 11/2002 | Williams et al. | |
| 6,480,013 B1 | 11/2002 | Nayler et al. | |
| 6,481,939 B1 | 11/2002 | Gillespie et al. | |
| 6,483,327 B1 | 11/2002 | Bruce et al. | |
| 6,483,336 B1 | 11/2002 | Harris et al. | |
| 6,486,687 B2 * | 11/2002 | Harwood et al. | 324/754 |
| 6,488,405 B1 | 12/2002 | Eppes et al. | |
| 6,489,789 B2 | 12/2002 | Peters et al. | |
| 6,490,471 B2 | 12/2002 | Svenson et al. | |

| | | |
|---|---|---|
| 6,492,822 B2 * | 12/2002 | Schwindt et al. .......... 324/754 |
| 6,501,289 B1 | 12/2002 | Takekoshi |
| 6,512,482 B1 | 1/2003 | Nelson et al. |
| 6,515,494 B1 | 2/2003 | Low |
| 6,528,993 B1 | 3/2003 | Shin et al. |
| 6,529,844 B1 | 3/2003 | Kapetanic et al. |
| 6,548,311 B1 | 4/2003 | Knoll |
| 6,549,022 B1 | 4/2003 | Cole, Jr. et al. |
| 6,549,026 B1 | 4/2003 | DiBattista et al. |
| 6,549,106 B2 | 4/2003 | Martin |
| 6,566,079 B2 | 5/2003 | Hefti |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,603,322 B1 | 8/2003 | Boll et al. |
| 6,605,951 B1 | 8/2003 | Cowan |
| 6,605,955 B1 | 8/2003 | Costello et al. |
| 6,608,494 B1 | 8/2003 | Bruce et al. |
| 6,608,496 B1 | 8/2003 | Strid et al. |
| 6,611,417 B2 | 8/2003 | Chen |
| 6,617,862 B1 | 9/2003 | Bruce |
| 6,621,082 B2 | 9/2003 | Morita et al. |
| 6,624,891 B2 | 9/2003 | Marcus et al. |
| 6,627,461 B2 | 9/2003 | Chapman et al. |
| 6,628,503 B2 | 9/2003 | Sogard |
| 6,628,980 B2 | 9/2003 | Atalar et al. |
| 6,633,174 B1 | 10/2003 | Satya et al. |
| 6,636,059 B2 * | 10/2003 | Harwood et al. .......... 324/754 |
| 6,636,182 B2 | 10/2003 | Mehltretter |
| 6,639,415 B2 | 10/2003 | Peters et al. |
| 6,639,461 B1 | 10/2003 | Tam et al. |
| 6,642,732 B2 | 11/2003 | Cowan et al. |
| 6,643,597 B1 | 11/2003 | Dunsmore |
| 6,653,903 B2 | 11/2003 | Leich et al. |
| 6,657,601 B2 | 12/2003 | McLean |
| 6,686,753 B1 | 2/2004 | Kitahata |
| 6,701,265 B2 | 3/2004 | Hill et al. |
| 6,707,548 B2 | 3/2004 | Kreimer et al. |
| 6,710,798 B1 | 3/2004 | Hershel et al. |
| 6,717,426 B2 | 4/2004 | Iwasaki |
| 6,720,782 B2 | 4/2004 | Schwindt et al. |
| 6,724,205 B1 | 4/2004 | Hayden et al. |
| 6,724,928 B1 | 4/2004 | Davis |
| 6,727,716 B1 | 4/2004 | Sharif |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,739,208 B2 * | 5/2004 | Hyakudomi ............... 73/865.8 |
| 6,744,268 B2 | 6/2004 | Hollman |
| 6,753,679 B1 | 6/2004 | Kwong et al. |
| 6,753,699 B2 | 6/2004 | Stockstad |
| 6,756,751 B2 * | 6/2004 | Hunter ....................... 318/135 |
| 6,768,328 B2 | 7/2004 | Self et al. |
| 6,770,955 B1 | 8/2004 | Coccioli et al. |
| 6,771,090 B2 | 8/2004 | Harris et al. |
| 6,771,806 B1 | 8/2004 | Satya et al. |
| 6,774,651 B1 | 8/2004 | Hembree |
| 6,777,964 B2 | 8/2004 | Navratil et al. |
| 6,778,140 B1 | 8/2004 | Yeh |
| 6,784,679 B2 | 8/2004 | Sweet et al. |
| 6,788,093 B2 | 9/2004 | Aitren et al. |
| 6,791,344 B2 | 9/2004 | Cook et al. |
| 6,794,888 B2 | 9/2004 | Kawaguchi et al. |
| 6,794,950 B2 | 9/2004 | Du Toit et al. |
| 6,798,226 B2 | 9/2004 | Altmann et al. |
| 6,801,047 B2 | 10/2004 | Harwood et al. |
| 6,806,724 B2 | 10/2004 | Hayden et al. |
| 6,806,836 B2 | 10/2004 | Ogawa et al. |
| 6,809,533 B1 | 10/2004 | Anlage et al. |
| 6,812,718 B1 | 11/2004 | Chong et al. |
| 6,822,463 B1 | 11/2004 | Jacobs |
| 6,836,135 B2 | 12/2004 | Harris et al. |
| 6,838,885 B2 | 1/2005 | Kamitani |
| 6,842,024 B2 | 1/2005 | Peters et al. |
| 6,843,024 B2 | 1/2005 | Nozaki et al. |
| 6,847,219 B1 | 1/2005 | Lesher et al. |
| 6,856,129 B2 | 2/2005 | Thomas et al. |
| 6,861,856 B2 | 3/2005 | Dunklee et al. |
| 6,864,694 B2 | 3/2005 | McTigue |
| 6,873,167 B2 | 3/2005 | Goto et al. |
| 6,885,197 B2 | 4/2005 | Harris et al. |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,941 B2 | 6/2005 | Sun |
| 6,903,563 B2 | 6/2005 | Yoshida et al. |
| 6,914,244 B2 | 7/2005 | Alani |
| 6,914,580 B2 | 7/2005 | Leisten |
| 6,927,079 B1 | 8/2005 | Fyfield |
| 6,937,341 B1 | 8/2005 | Woollam et al. |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,088,981 B2 | 8/2006 | Chang |
| 7,096,133 B1 | 8/2006 | Martin et al. |
| 7,101,797 B2 | 9/2006 | Yuasa |

| | | |
|---|---|---|
| 7,187,188 B2 | 3/2007 | Andrews et al. |
| 7,188,037 B2 | 3/2007 | Hidehira |
| 7,190,181 B2 * | 3/2007 | Peters et al. ............... 324/754 |
| 7,250,752 B2 * | 7/2007 | Peters et al. ............... 324/158.1 |
| 7,250,779 B2 * | 7/2007 | Dunklee et al. ............ 324/754 |
| 7,292,057 B2 * | 11/2007 | Cowan et al. ............... 324/760 |
| 2001/0002794 A1 | 6/2001 | Draving et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0066551 A1 * | 6/2002 | Stone et al. ............... 165/138 |
| 2002/0070743 A1 | 6/2002 | Felici et al. |
| 2002/0070745 A1 | 6/2002 | Johnson et al. |
| 2002/0075027 A1 | 6/2002 | Hollman et al. |
| 2002/0079911 A1 | 6/2002 | Schwindt |
| 2002/0118009 A1 | 8/2002 | Hollman et al. |
| 2002/0118034 A1 | 8/2002 | Laureantl |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Alexander |
| 2003/0062915 A1 | 4/2003 | Arnold et al. |
| 2003/0071631 A1 | 4/2003 | Alexander |
| 2003/0072549 A1 | 4/2003 | Facer et al. |
| 2003/0077649 A1 | 4/2003 | Cho et al. |
| 2003/0088180 A1 | 5/2003 | VanVeen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0141861 A1 | 7/2003 | Navratil et al. |
| 2003/0155939 A1 | 8/2003 | Lutz et al. |
| 2003/0156270 A1 * | 8/2003 | Hunter ....................... 355/72 |
| 2003/0170898 A1 | 9/2003 | Gunderson et al. |
| 2003/0184332 A1 | 10/2003 | Tomimatsu et al. |
| 2004/0015060 A1 | 1/2004 | Samsoonder et al. |
| 2004/0021475 A1 | 2/2004 | Ito et al. |
| 2004/0061514 A1 | 4/2004 | Schwindt et al. |
| 2004/0068181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113639 A1 | 6/2004 | Dunklee et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0147034 A1 | 7/2004 | Gore et al. |
| 2004/0162689 A1 | 8/2004 | Jamneala et al. |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0251922 A1 | 12/2004 | Martens et al. |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0083130 A1 | 4/2005 | Grilo |
| 2005/0099192 A1 | 5/2005 | Dunklee et al. |
| 2005/0101846 A1 | 5/2005 | Fine et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0174191 A1 | 8/2005 | Brunker et al. |
| 2005/0178980 A1 | 8/2005 | Skidmore et al. |
| 2005/0195124 A1 | 9/2005 | Puente Ballarda et al. |
| 2005/0227503 A1 | 10/2005 | Reitinger |
| 2005/0236587 A1 | 10/2005 | Kodama et al. |
| 2005/0237102 A1 | 10/2005 | Tanaka |
| 2006/0052075 A1 | 3/2006 | Galivanche et al. |
| 2006/0114012 A1 | 6/2006 | Reitinger |
| 2006/0155270 A1 | 7/2006 | Hancock et al. |
| 2006/0158207 A1 | 7/2006 | Reitinger |
| 2006/0226864 A1 | 10/2006 | Kramer |
| 2007/0024506 A1 | 2/2007 | Hardacker |
| 2007/0030021 A1 | 2/2007 | Cowan et al. |
| 2007/0247178 A1 * | 10/2007 | Dunklee et al. ............ 324/754 |
| 2007/0247180 A1 * | 10/2007 | Peters et al. ............... 324/755 |
| 2007/0290700 A1 * | 12/2007 | Schwindt et al. ........... 324/754 |
| 2007/0290703 A1 * | 12/2007 | Hollman .................... 324/760 |

FOREIGN PATENT DOCUMENTS

| | | |
|---|---|---|
| DE | 29 12 826 | 10/1980 |
| DE | 31 14 466 | 3/1982 |
| DE | 31 25 552 | 11/1982 |
| DE | 3637549 | 5/1988 |
| DE | 41 09 908 | 10/1992 |
| DE | 43 16 111 | 11/1994 |
| DE | 94 06 227 | 10/1995 |
| DE | 195 41 334 | 9/1996 |
| DE | 196 16 212 | 10/1996 |
| DE | 19522774 | 1/1997 |
| DE | 196 18 717 | 1/1998 |
| DE | 288 234 | 3/1999 |
| DE | 693 22 206 | 4/1999 |
| DE | 10000324 | 7/2001 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 574 149 A1 | 5/1993 |
| EP | 0574149 A1 * | 5/1993 |
| EP | 0 574 149 | 12/1993 |
| EP | 0 706 210 | 4/1996 |
| EP | 0 505 981 | 6/1998 |
| EP | 0 573 183 | 1/1999 |
| EP | 0 945 736 | 9/1999 |
| GB | 2 197 081 | 5/1988 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |

| | | |
|---|---|---|
| JP | 57-075480 | 5/1982 |
| JP | 57-163035 | 10/1982 |
| JP | 62-011243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |
| JP | 63-129640 | 6/1988 |
| JP | 63-143814 | 6/1988 |
| JP | 63-160355 | 7/1988 |
| JP | 63-318745 | 12/1988 |
| JP | 1-165968 | 6/1989 |
| JP | 1-176872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |
| JP | 2-191352 | 7/1990 |
| JP | 2-220453 | 9/1990 |
| JP | 3-67187 | 3/1991 |
| JP | 3-175367 | 7/1991 |
| JP | 3-196206 | 8/1991 |
| JP | 3-228348 | 10/1991 |
| JP | 4-732 | 1/1992 |
| JP | 4-130639 | 5/1992 |
| JP | 4-159043 | 6/1992 |
| JP | 4-206930 | 7/1992 |
| JP | 4-340248 | 11/1992 |
| JP | 5-082631 | 4/1993 |
| JP | 5-157790 | 6/1993 |
| JP | 51-57790 | 6/1993 |
| JP | 5-166893 | 7/1993 |
| JP | 51-56893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-5197 | 1/1995 |
| JP | 7-12871 | 1/1995 |
| JP | 7005078 | 1/1995 |
| JP | 7-273509 | 10/1995 |
| JP | 8-35987 | 2/1996 |
| JP | 8-261898 | 10/1996 |
| JP | 8-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2002033374 | 1/2002 |
| JP | 2002-164396 | 6/2002 |
| JP | 2002164396 A * | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 01/69856 | 9/2001 |
| WO | WO 2004/049395 | 6/2004 |
| WO | WO 2004049395 A2 * | 6/2004 |
| WO | WO 2004/065944 | 8/2004 |
| WO | WO 2004/079299 | 9/2004 |
| WO | WO 2005/062025 | 7/2005 |

OTHER PUBLICATIONS

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.
Cascade Microtech, "Introducing the peak of analytical probe stations," MicroProbe Update, May 1990.
H.-J. Eul and B. Schiek, "Thru-Match-Reflect: One Result of a Rigorous Theory for De-Embedding and Network Analyzer Calibration," 18th European Microwave Conference '88, The International Conference Designed for the Microwave Community, Published by Microwave Exhibitions and Publishers Limited, Sep. 12-16, 1988, Stockhol, Sweden.
Cascade Microtech, "Analytical Probe Station," Summit 9000 Series, Jun. 1, 1990.
Maury Microwave Corporation, "MT950D Series, Transistor Test Fixture Software, Software Application Packs," Sep. 20, 1982.
Eric Phizicky, Philippe I.H. Bastiaens, Heng Zhu, Michael Snyder, & Stanley Fields, "Protein analysis on a proteomic scale," Nature 422, insight: review article, Mar. 13, 2003.
Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.
Eric Strid (Cascade Microtech), "Planar Impedance Standards and Accuracy Considerations In Vector Network Analysis," Jun. 1986, 8 pages.
Maury Microwave Corporation, "MT950 Series Transistor Test Fixture (TTF) Notice! Notice! Notice!," May 31, 1985.
Maury Microwave Corporation, MT950 Series Transistor Test Fixture (TTF), Oct. 7, 1982, 4 pages.
Design Technique, "Microstrip Microwave Test Fixture," May 1986, 2 pages.
Photo: Micromanipulator Probe Station 1994.
Micromanipulator Sales and Services Inc., "Test Station Accessories," Copyright 1983, 1984, 1 page.
Ruedi Aebersold & Matthias Mann, "Insight Review Articles, Mass spectrometry-based proteomics," Nature, vol. 422, Mar. 13, 2003, pp. 198-207.
Keithley Instruments, Inc. "Low-Level Measurements for Effective Low Current, Low Voltage, and High Impedance Measurements," Revised Third Edition, Printed Jun. 1984.
Hewlett Packard, "HP 4284A Precision LCR Meter Operation Manual (Including Option 001,002,006,201,202,301)," Third Edition, Dec. 1991, pp. 2-1, 6-9, 6-15.
Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.
Cascade Microtech Technical Brief, A Guide to Better Vector Network Analyzer Calibrations for Probe-Tip Measurements, Copyright 1994, 2 pages.
TEMPTRONIC, "Guarded" Chuck Sketch, Nov. 15, 1989.
Andrej Sali, Robert Glaeser, Thomas Earnest & Wolfgang Baumeister, "From words to literature in structural proteomics," Insight: Review Article, Nature 422, pp. 216-225, Mar, 13, 2003.
Mike Tyers & Matthias Mann, "From genomics to proteomics," Insight overview, Nature vol. 422 Mar. 2003, pp. 193-197.
William Knauer, "Fixturing for Low-Current/Low-Voltage Parametric Testing," Evaluation Engineering, Nov. 1990, pp. 9-12.
J.D. Tompkins, "Evaluating High Speed AC Testers," IBM Technical Disclosure Bulletin, vol. 13, No. 7 Dec. 1970, p. 180.
Jim Fitzpatrick, "Error Models for Systems Measurement," Microwave Journal, May 1978, pp. 63-66.
Sam Hanash, "Disease proteomics," Insight Review Articles, Nature, vol. 422, Mar. 13, 2003, pp. 226-232.
Design Technique International, "Adjustable Test Fixtures," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R. Y. Koyama & M. G. Buehler, "Semiconductor Measurement Technology: A Wafer Chuck for Use Between -196 and 350° C." U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

L. L. Sohn, O. A. Saleh, G. R. Facer, A. J. Beavis, R. S. Allan, & D. A. Notterman, "Capacitance Cytometry: Measuring biological cells one by one" PNAS vol. 97, No. 20 Sep. 26, 2000, pp. 10687-10690.

Mark S. Boguski & Martin W. McIntosh, "Biomedical informatics for proteomics," Insight: review article, Nature 422, Mar. 13, 2003, pp. 233-237.

The Micromanipulator Company, Inc., "Model 8000 Test Station," 1988, 1 page.

The Micromanipulator Company, Inc. "Model 8000 Test Station," 1988, 1 page.

Microwave Products, Microwave Journal, Sep. 1988, 1 page.

Saswata Basu & Leonard Hayden, "An SOLR Calibration for Accurate Measurement of Orthogonal On-Wafer Duts," IEEE MTT-S Digest, 1997, pp. 1335-1336, 1338.

Hewlett Packard, "HP 4142B Modular DC source/Monitor Practical Applications—High Speed DC Characterization of Semiconductor Devices from Sub pA to 1A," Nov. 1987, pp. 1-4.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 576, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibit 585, May 13, 1998, 7 pages.

Barbara Marte, Senior Editor, "Nature Insight Proteomics," Nature vol. 422, Mar. 13, 2003 pp. 191-194.

Qingqing Liang, et al., "Accurate ac Transistor Characterization to 110 GHz Using a New Four-port Self-Callibrated Extraction Technique," IEEE, 2004 Topical Meeting on Silicon Monolithic Integrated Circuits in RF Systems, pp. 282-285.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Institute of Physics, pp. 1354-1356.

Cascade Microtech, "Probe Heads Care and cleaning of coaxial input microwave probes," Microwave Probe Care and Cleaning, Instruction Manual, Copyright 1990.

\* cited by examiner

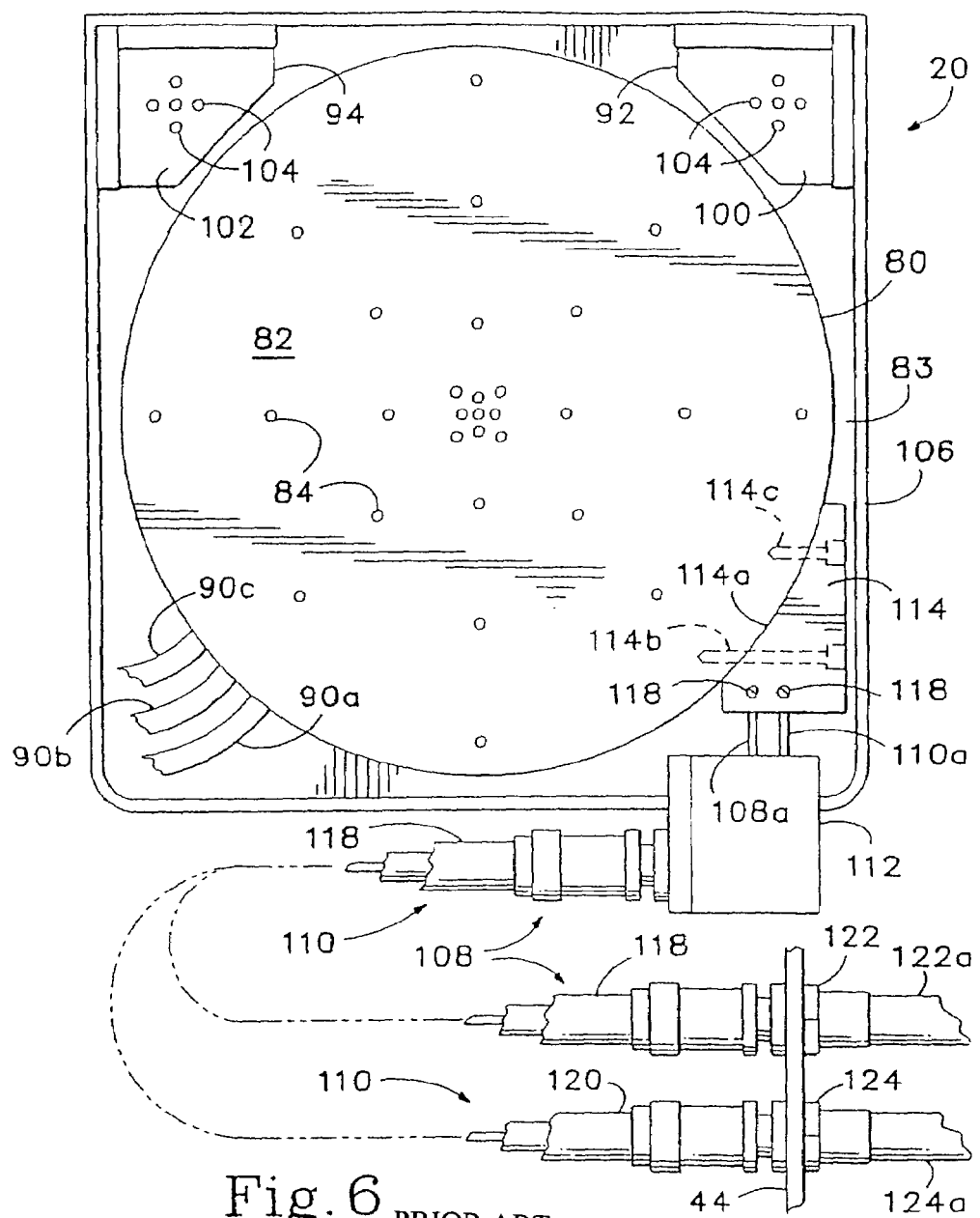
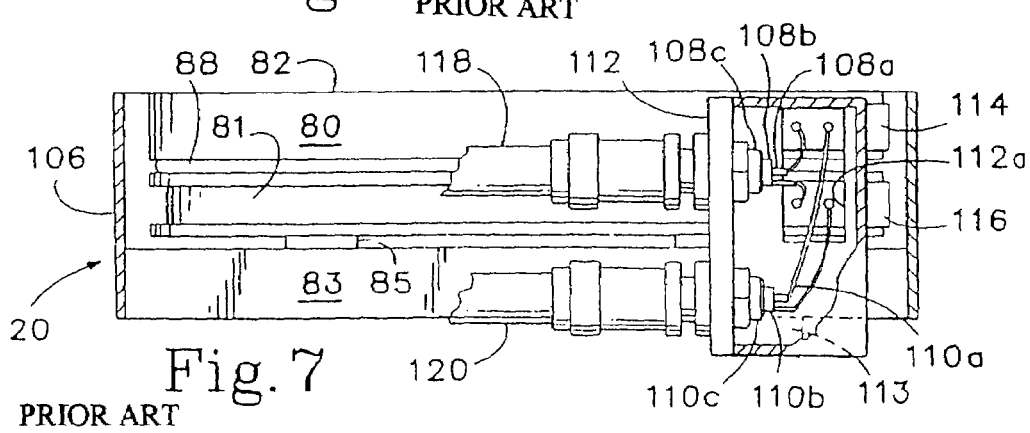
Fig. 6 PRIOR ART
Fig. 7 PRIOR ART

CHUCK WITH INTEGRATED WAFER SUPPORT

CROSS-REFERENCE TO RELATED APPLICATIONS

This application is a continuation of U.S. Pat. App. No. 10/927,247, filed Aug. 26, 2004, now U.S. Pat. No. 7,187,188 which claims the benefit of U.S. Prov. App. No. 60/532,757, filed Dec. 24, 2003.

BACKGROUND OF THE INVENTION

The present application relates to an improved chuck and an improved probe station.

With reference to FIGS. 1, 2 and 3, a probe station comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e. horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing. The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18 a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

With particular reference to FIGS. 3, 6 and 7, the chuck assembly 20 is a modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. Element 83 is a conductive rectangular stage or shield 83 which detachably mounts conductive elements 80 and 81 of circular shape. The element 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c (FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3 and 3A, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably the spacers and washers 85 and 86, respectively, are constructed of a material having the lowest possible dielectric constant consistent with high dimensional stability and high volume resistivity. A suitable material for the spacers and washers is glass epoxy, or acetal homopolymer marketed under the trademark Delrin by E. I. DuPont.

With reference to FIGS. 6 and 7, the chuck assembly 20 also includes a pair of detachable electrical connector assemblies designated generally as 108 and 110, each having at least two conductive connector elements 108a, 108b and 110a, 110b, respectively, electrically insulated from each other, with the connector elements 108b and 110b preferably coaxially surrounding the connector elements 108a and 110a as guards therefor. If desired, the connector assemblies 108 and 110 can be triaxial in configuration so as to include respective outer shields 108c, 110c surrounding the respective connector elements 108b and 110b, as shown in FIG. 7. The outer shields 108c and 110c may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108a and 110a are electrically connected in parallel to a connector plate 114 matingly and detachably connected along a curved contact surface 114a by screws 114b and 114c to the curved edge of the chuck assembly element 80. Conversely, the connector elements 108b and 110b are connected in parallel to a connector plate 116 similarly matingly connected detachably to element 81. The connector elements pass freely through a rectangular opening 112a in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122a, 124a are detachably connectable to the connectors 122 and 124 from suitable test equipment such as a Hewlett-Packard 4142B modular DC source/monitor or a Hewlett-Packard 4284A precision LCR meter, depending upon the test application. If the cables 118 and 120 are merely coaxial cables or other types of cables having only two conductors, one conductor interconnects the inner (signal) connector element of a respective connector 122 or 124 with a respective connector element 108a or 110a, while the other conductor connects the intermediate (guard) connector element of a respective connector 122 or 124 with a respective connector element 108b, 110b. U.S. Pat. No. 5,532,609 discloses a probe station and chuck and is hereby incorporated by reference.

The chuck assembly 20 with corresponding vertical apertures 84 and respective chambers separated by O-rings 88 permits selectively creating a vacuum within three different zones. Including the three O-rings 88 and the dielectric spacers 85 surrounding the metallic screws 96 permits securing adjacent first, second and third chuck assembly elements 80, 81 and 83 together. The concentric O-rings 88 are squeezed by the first and second chuck assembly elements and assist in distributing the force across the upper surface of the chuck assembly 20 to maintain a flat surface. However, the O-rings and dielectric spacers 85 have a greater dielectric constant than the surrounding air resulting in leakage currents. Also, the additional material between adjoining chuck assembly elements 80, 81, and 83 decreases the capacitance between the adjoining chuck assembly elements. Moreover, the dielectric material of the O-rings and dielectric spacers 85 builds up a charge therein during testing which increases the dielectric absorption. The O-rings and dielectric spacers 85 provides mechanical stability against warping the chuck when a wafer thereon is probed so that thinner chuck assembly elements 80, 81, and 83 may be used. The height of the different O-rings and dielectric spacers 85 tend to be slightly different which introduces non-planarity in the upper surface when the first, second, and third chuck assembly elements 80, 81, and 83 are secured together.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 2A is a partial top view of the wafer probe station of FIG. 1 with the enclosure door shown partially open.

FIG. 6 is a partially schematic top detail view of the chuck assembly, taken along line 6-6 of FIG. 3.

FIG. 7 is a partially sectional front view of the chuck assembly of FIG. 6.

DETAILED DESCRIPTION OF PREFERRED EMBODIMENT

The present inventors considered existing roll out chuck stages and determined that it is easier to properly position a wafer on the rolled out chuck, together with the desired theta orientation of the wafer with respect to the chuck, when the chuck stage is extended at least partially outside of the chamber. Unfortunately, in the event that the chuck is heated or cooled, such as to 300 degrees Celsius or cooled significantly below ambient temperature, placing an ambient temperature wafer on the chuck tends to result in damage to the devices on the wafer or otherwise results in fracturing the wafer itself. In either case, the wafer is susceptible to becoming damaged. In some cases the user could manually hold the wafer on a wafer holder in the vicinity of the chuck until the wafer is sufficiently heated, but this is difficult at best, for the user to accomplish. Further, it is difficult to achieve similar such temperatures using a wafer holder because of the insulating effect of the wafer holder and the distance of the wafer from the surface of the chuck. Also, the user has a tendency to accidently touch the surface of the chuck with his hand, thus resulting in painful burning or freezing of his hand. In addition, even with a chuck at ambient temperature the wafer is typically placed on the upper surface of the chuck using a motion that is at an acute angle to the upper surface of the chuck, and accordingly, the wafer tends to slide across the chuck surface thus coming to rest at a non-desirable location, if it remains on the chuck at all.

Figure 1:
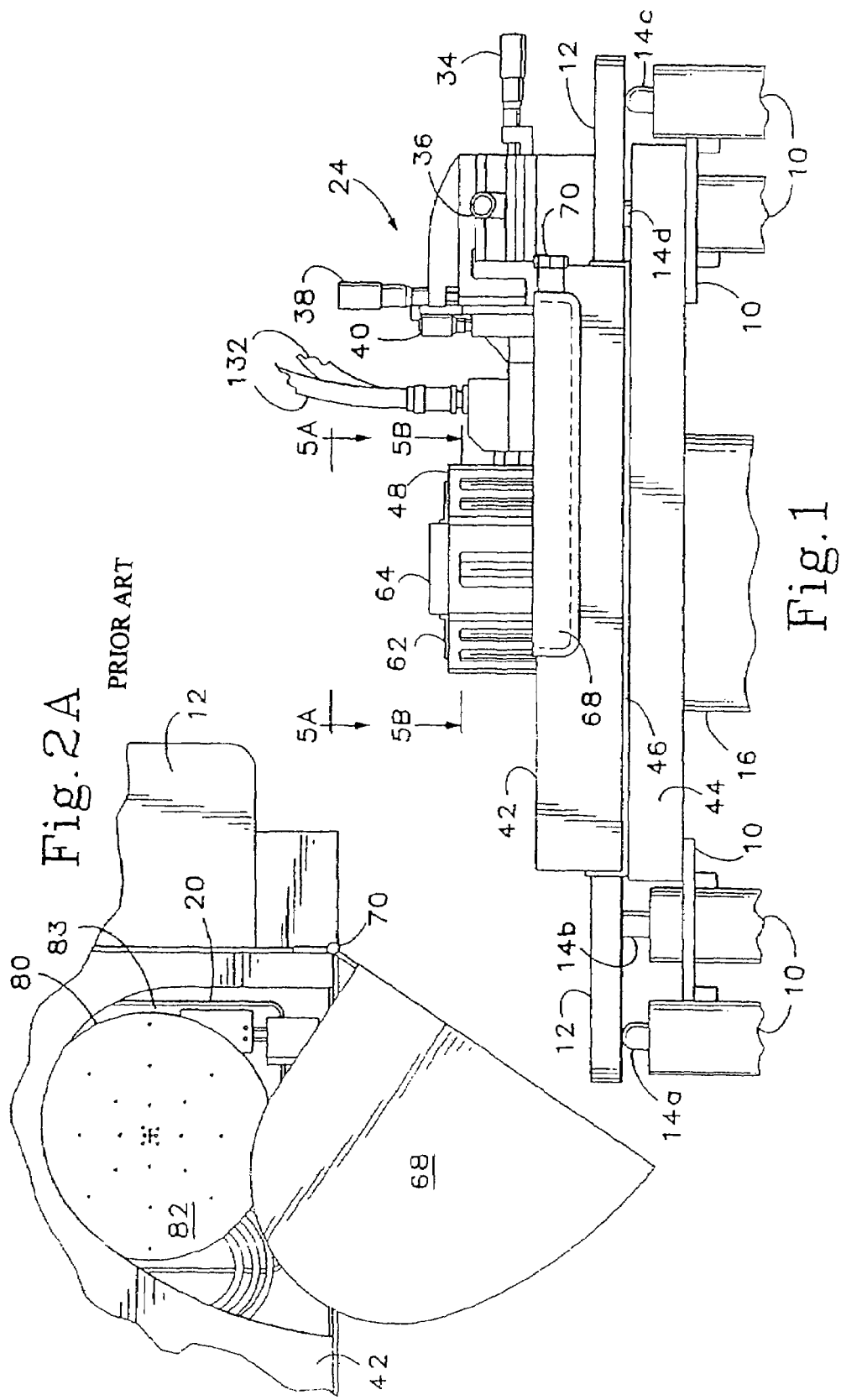
FIG. 1 is a partial front view of an exemplary embodiment of a wafer probe station constructed in accordance with the present invention.
Figure 2:
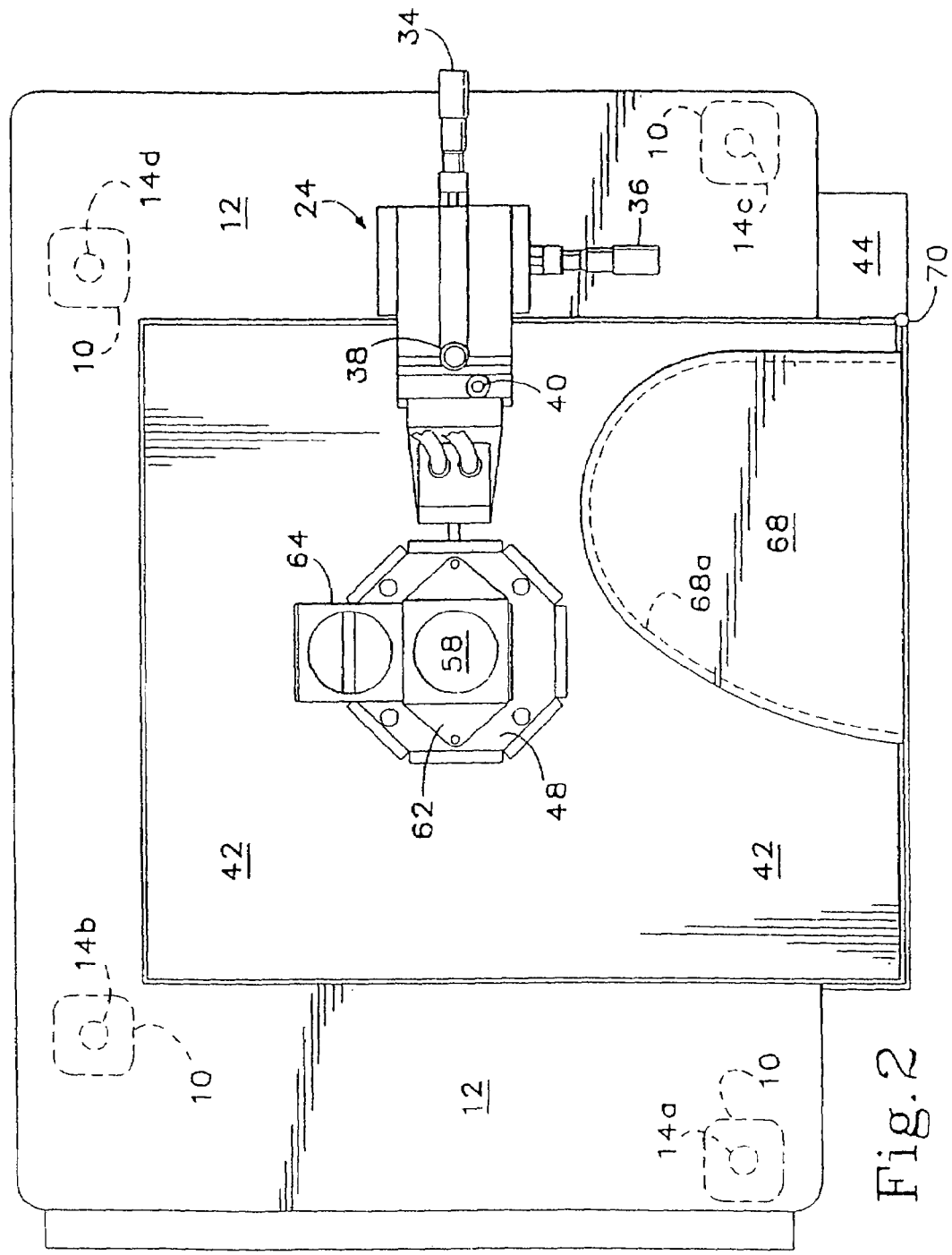
FIG. 2 is a top view of the wafer probe station of FIG. 1.
Figures 3, 3A:
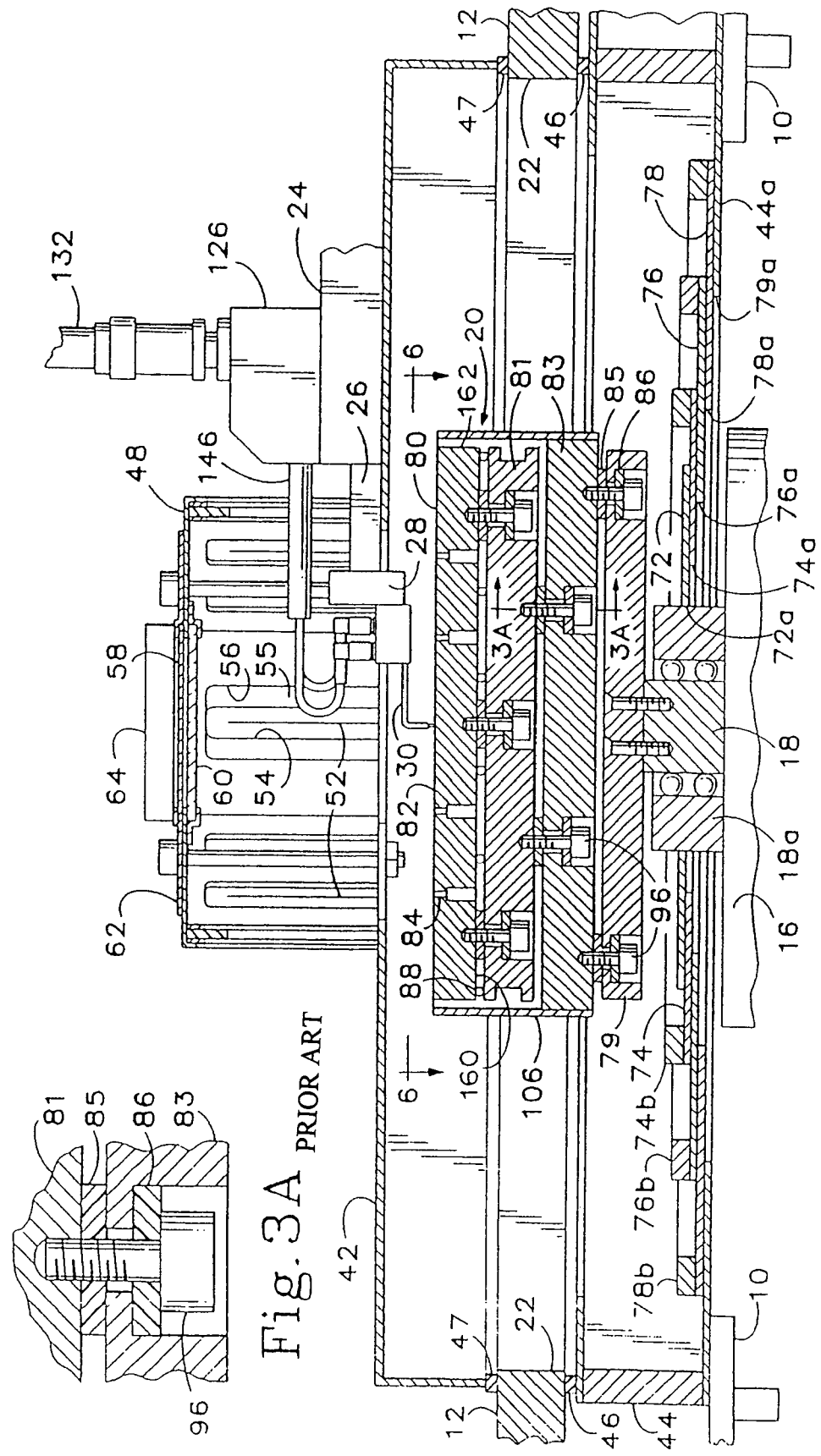
FIG. 3 is a partially sectional and partially schematic front view of the probe station of FIG. 1.
FIG. 3A is an enlarged sectional view taken along line 3A-3A of FIG. 3.
Figure 4:
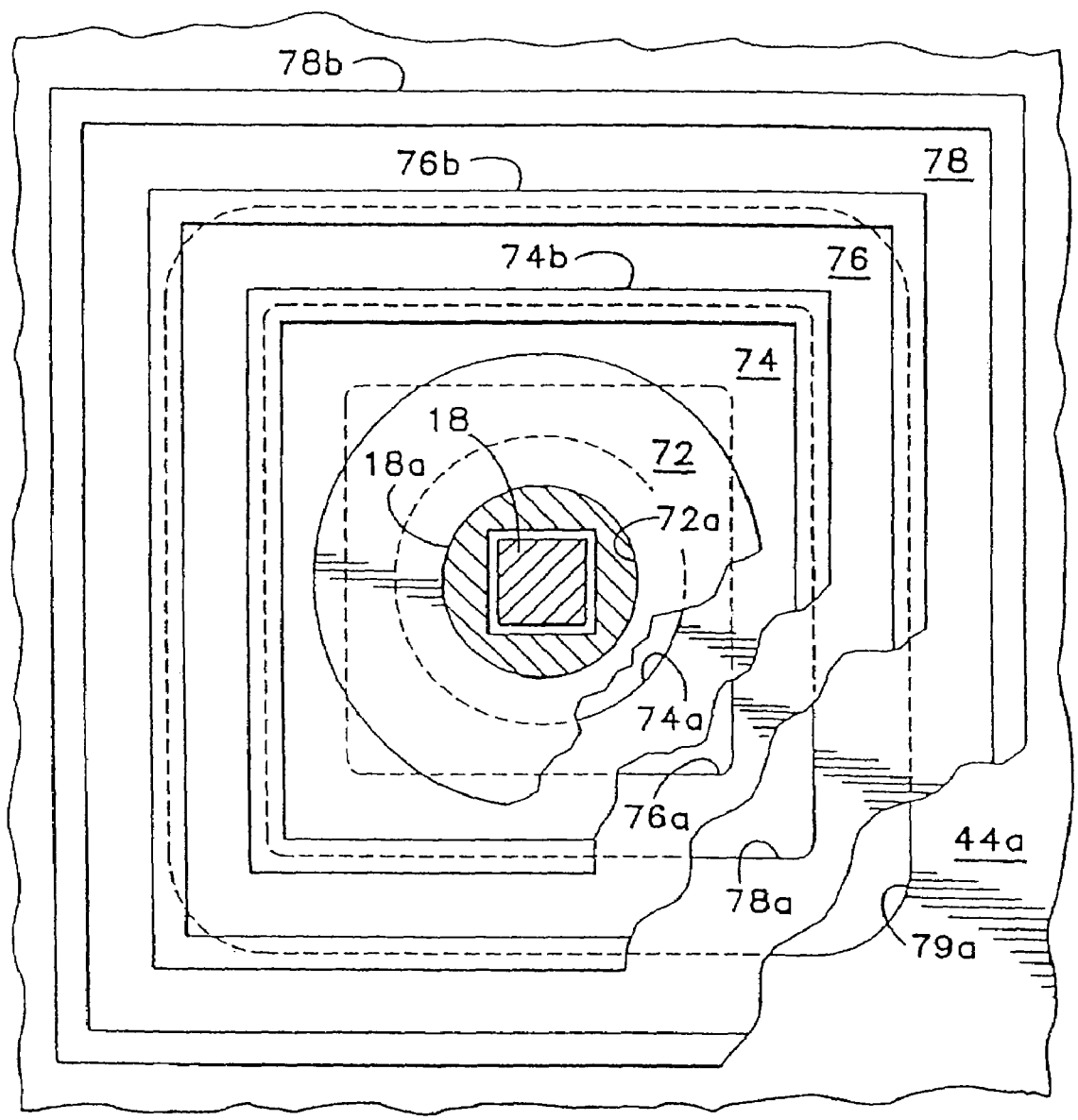
FIG. 4 is a top view of the sealing assembly where the motorized positioning mechanism extends through the bottom of the enclosure.
Figure 5A:
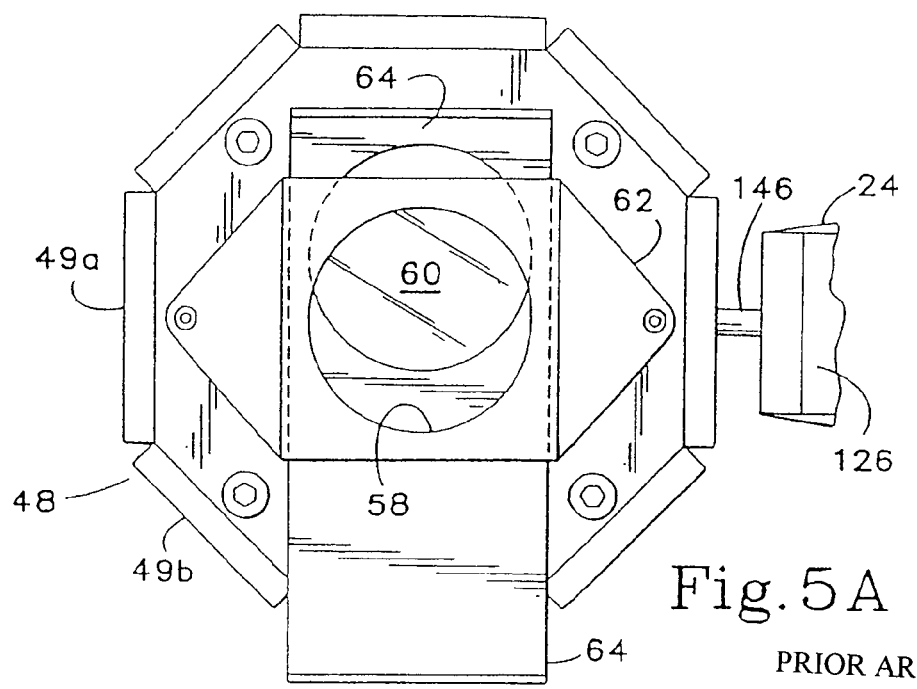
FIG. 5A is an enlarged top detail view taken along line 5A-5A of FIG. 1.
Figure 5B:
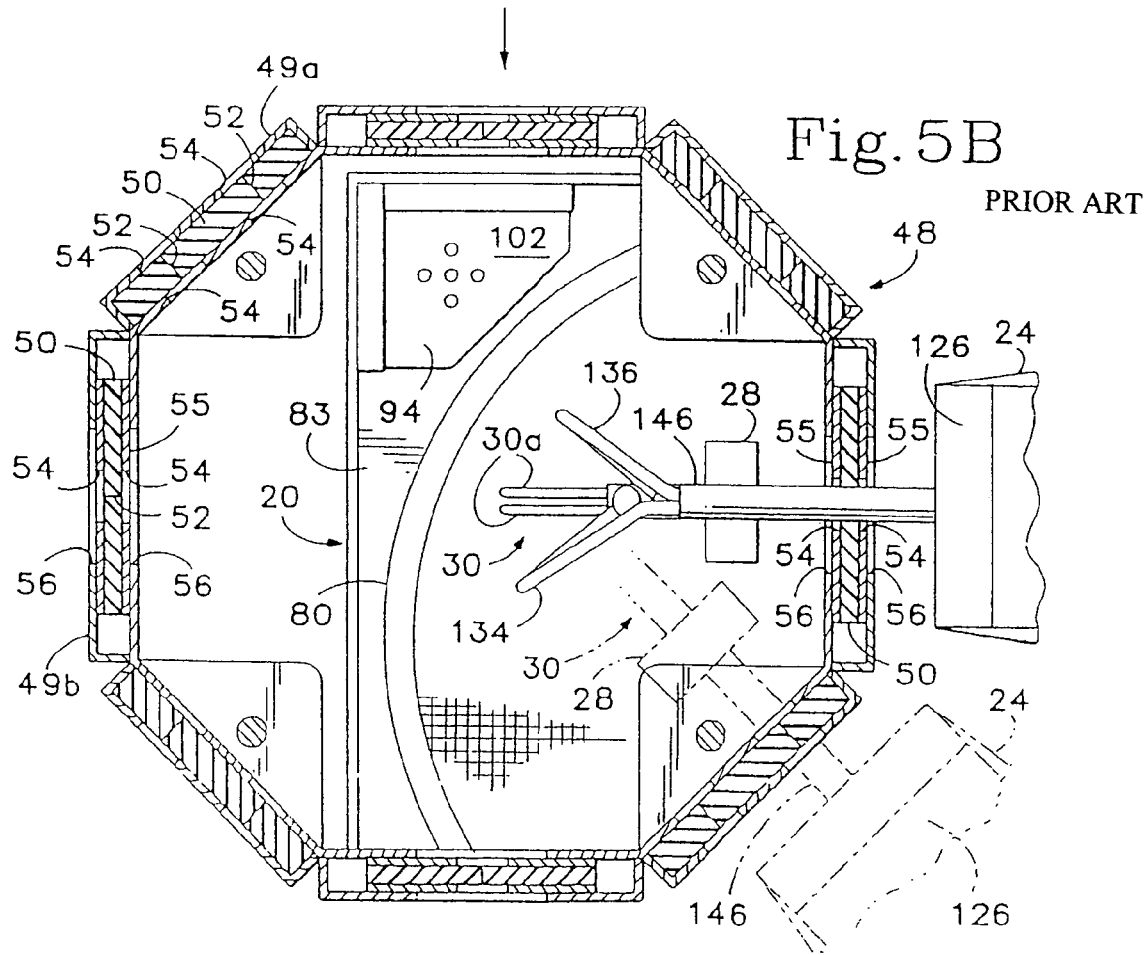
FIG. 5B is an enlarged top sectional view taken along line 5B-5B of FIG. 1.
Figure 8:
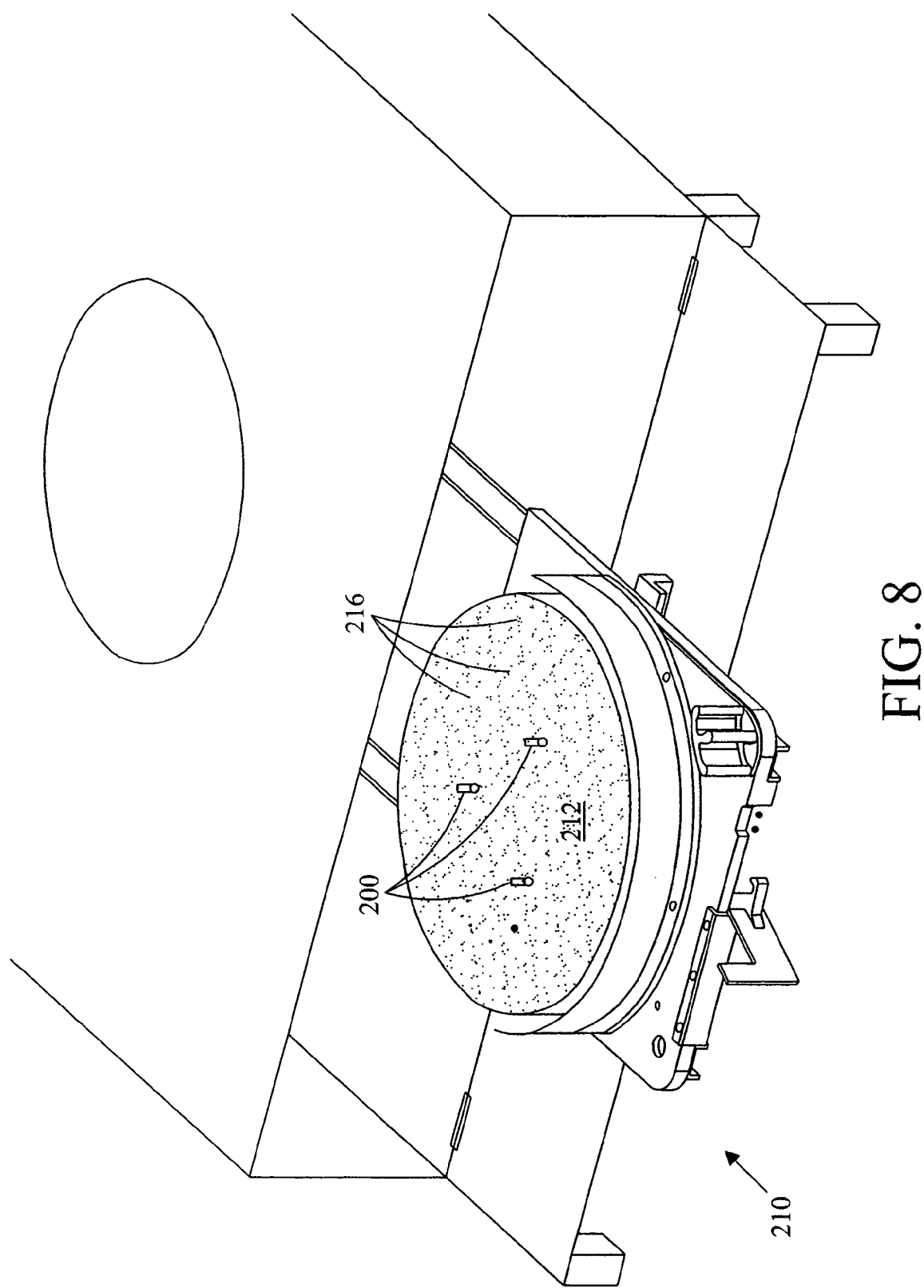
FIG. 8 illustrates a probe station with a chuck that includes a stage with lift pins that is movable without x, y, and z positioners.

Referring to FIG. 8, a roll-out includes a stage that is movable with respect to the chamber. Preferably, the stage at least partially exists the chamber while the x, y, z positioner remains within the chamber. To alleviate concerns the present inventors came to the realization that a set of movable pins 200, generally referred to as lift pins, incorporated within the roll-out chuck 210 would, (1) simplify the positioning of the wafer on the chuck by placing the wafer on the lift pins 200, (2) decrease the likelihood of damage to the user's hand by accidently touching the chuck surface 212, (3) permit the wafer to be held in a position above the chuck so that the wafer may adjust to a temperature closer to the temperature of the chuck surface, and/or (4) decrease the likelihood of the wafer sliding out of position. The lift pins 200 incorporated within the chuck 210 may include a plurality of members spatially arranged around the chuck 210 that may be selectively raised and/or lowered. Alternatively, the lift pins may remain stationary and the surface of the chuck may be raised or lowered. In any case, the lift pins 200 and upper surface 212 of the chuck 210 include relative vertical motion with respect to one another. The maximum distance between the top of the lift pins and the upper surface of the chuck is preferably approximately 0.25 inches.

Figure 9:
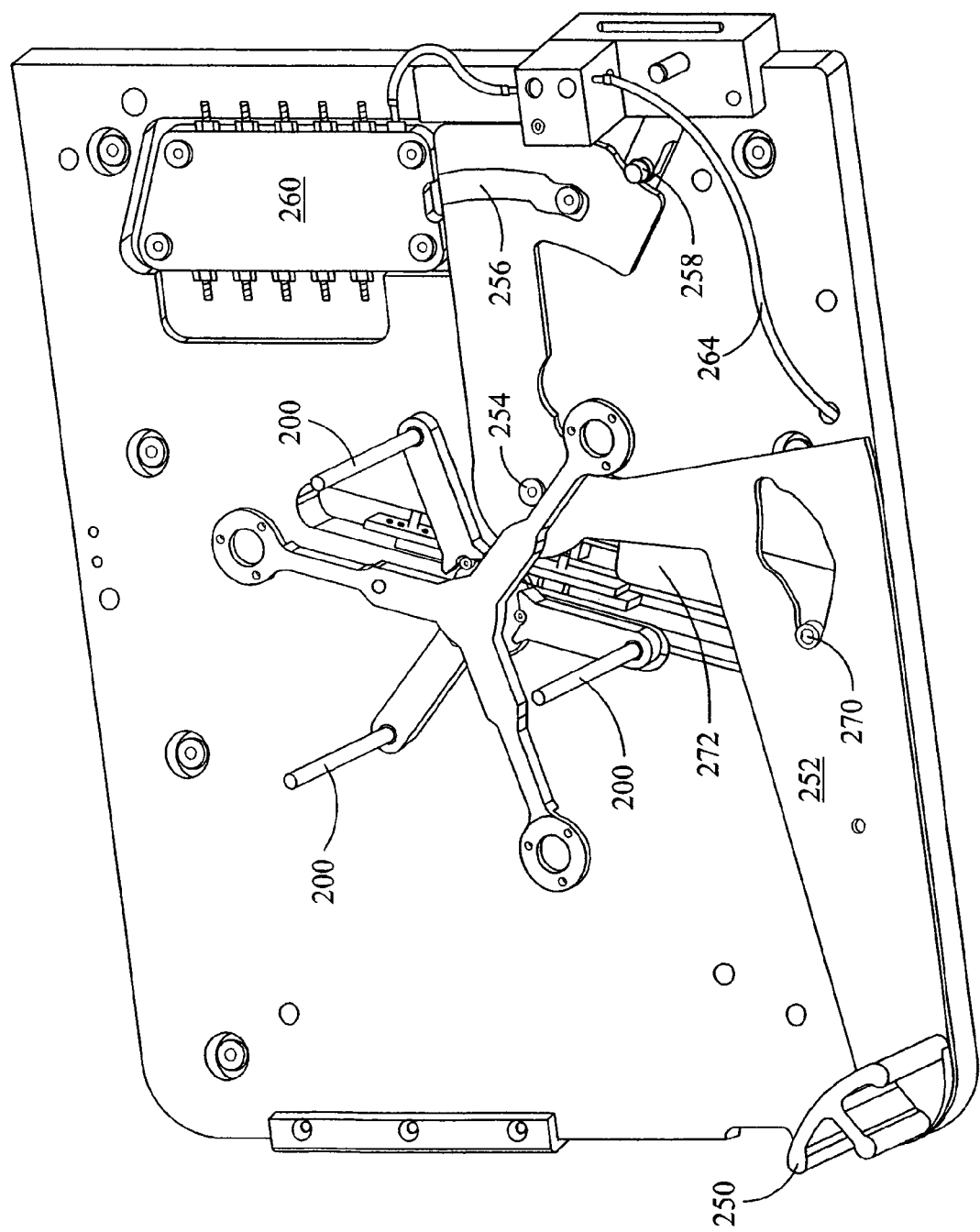
FIG. 9 illustrates a chuck with lift pins having a handle at zero degrees.
Figure 10:
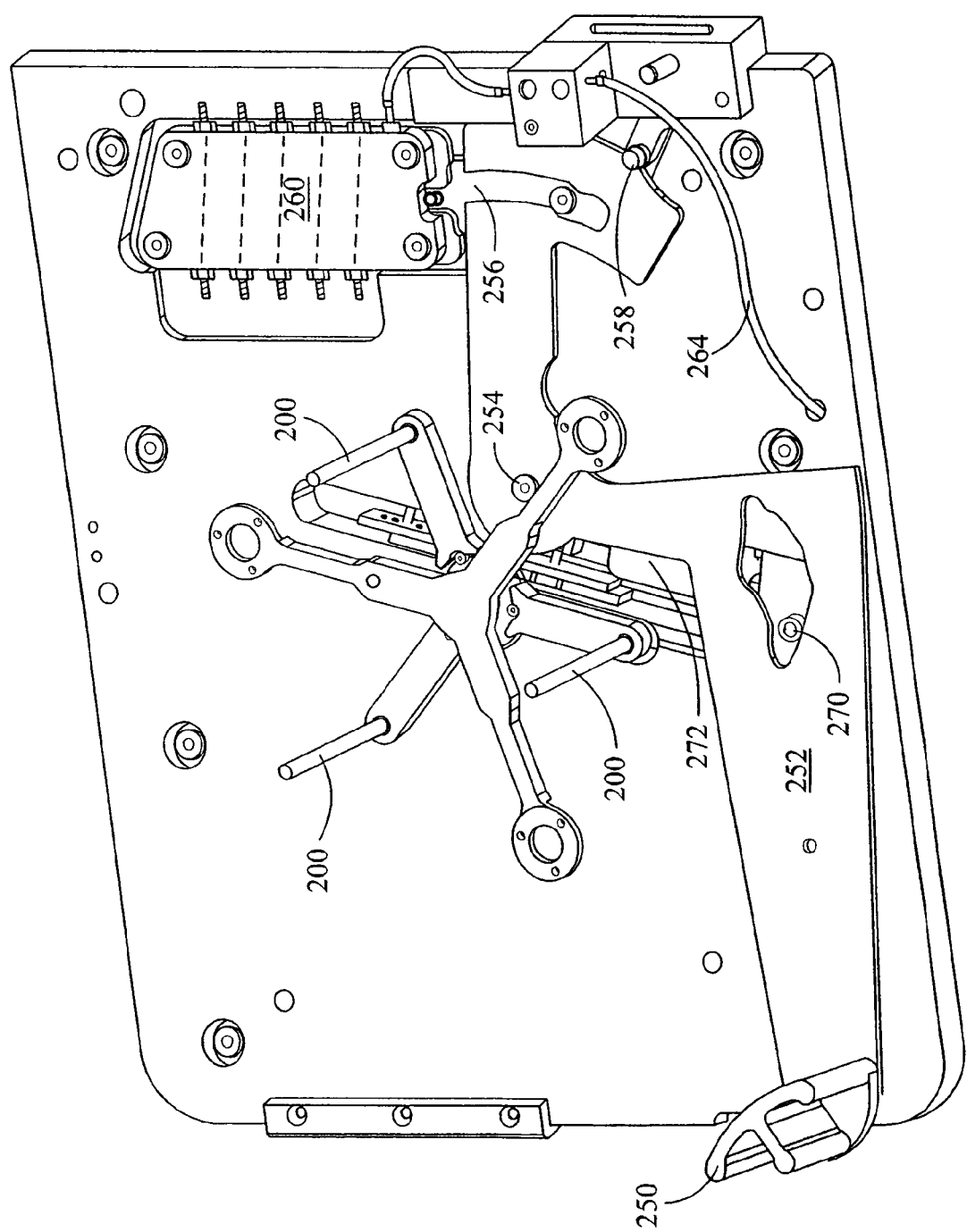
FIG. 10 illustrates a chuck with lift pins having a handle at six degrees.

One technique to engage the lift pins is to use a motor, such as a stepper motor, to lift the pins. The stepper motor may be controlled by software or otherwise by the user indicating the desire to lift or lower the lift pins. Another alternative to engage the lift pins is to use a pneumatic system that is controlled by software or otherwise by the user indicating the desire to lift or lower the lift pins. Another technique, that provides more tactile feedback to the user is to use a mechanical linkage system controlled by the user. Referring to FIG. 9, a mechanical linkage system includes a handle 250 connected to a lever 252 that rotates about pivot point 254 (0 degrees of rotation) that may be rotated as illustrated in FIG. 10 (6 degrees of rotation), FIG. 11 (12 degrees of rotation), and FIG. 12 (30 degrees of rotation) to fully extend the lift pins 200 above the upper surface of the chuck. With the lift pins 200 extended, as illustrated in FIG. 12, the wafer is properly positioned on the lift pins 200. In addition, in the event that the upper surface of the chuck is not at ambient temperature, the user is not likely to accidently touch the chuck. Also, the wafer may be slowly heated or cooled by being spaced apart from the upper surface of the chuck, which decreases the likelihood of damaging the devices on the wafer or otherwise fracturing the wafer itself.

When the lift pins are fully extended or otherwise are not fully retracted, the chuck 210 and the associated stage is locked out from being retracted within the chamber or otherwise being moved to a suitable probing position. The lift pins are considered fully retracted when the lift pins are lowered to a level substantially even with the upper surface of the chuck or lower. In many cases, when the lift pins are extended the wafer is at a higher elevation than when the lift pins are retracted. By inhibiting the stage from being retracted within the chamber when the lift pins are not fully retracted, or otherwise the lift pins are fully extended, reduces the likelihood that the wafer will inadvertently strike a probe upon retraction of the stage within the chamber.

Figure 11:
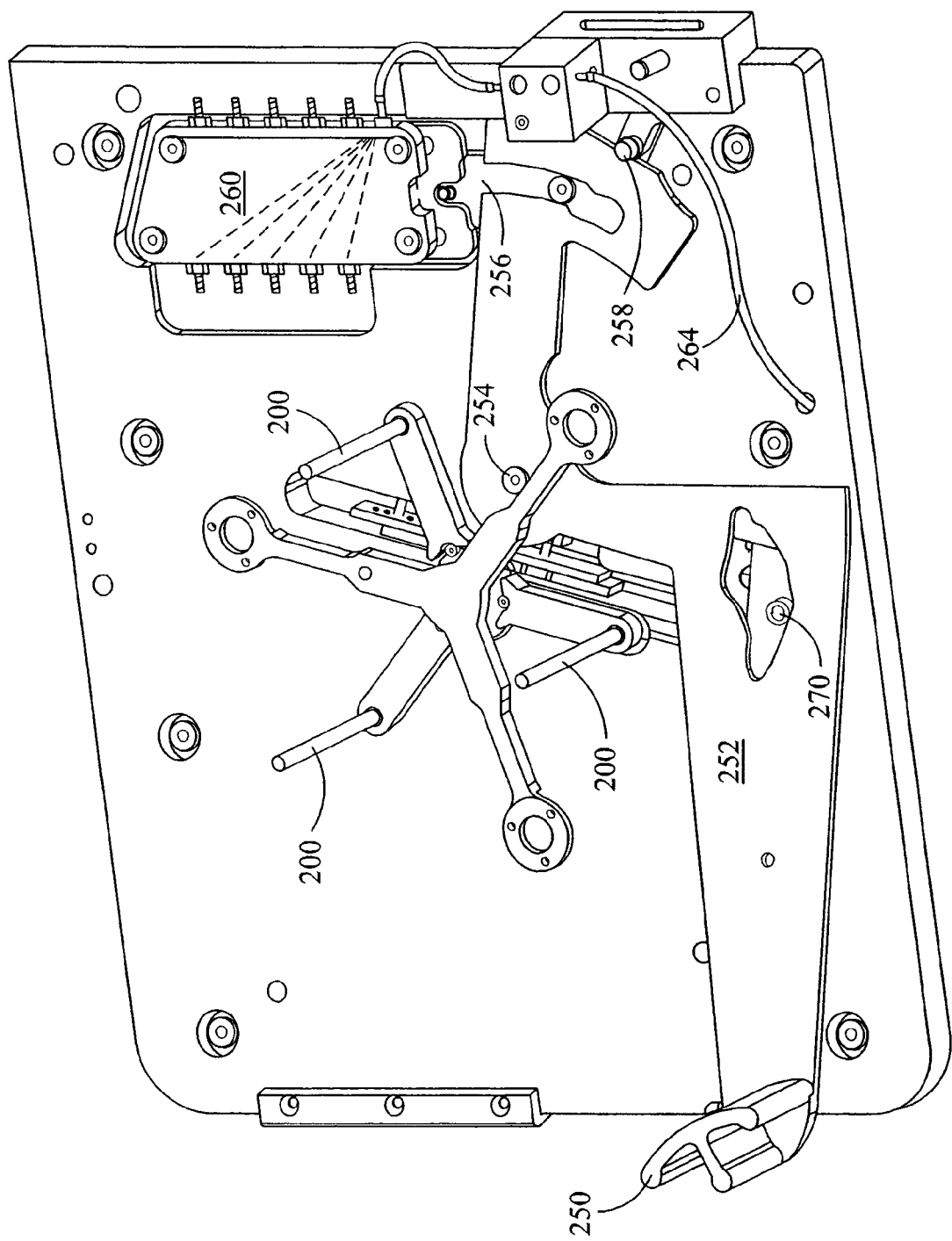
FIG. 11 illustrates a chuck with lift pins having a handle at 12 degrees.
Figure 12:
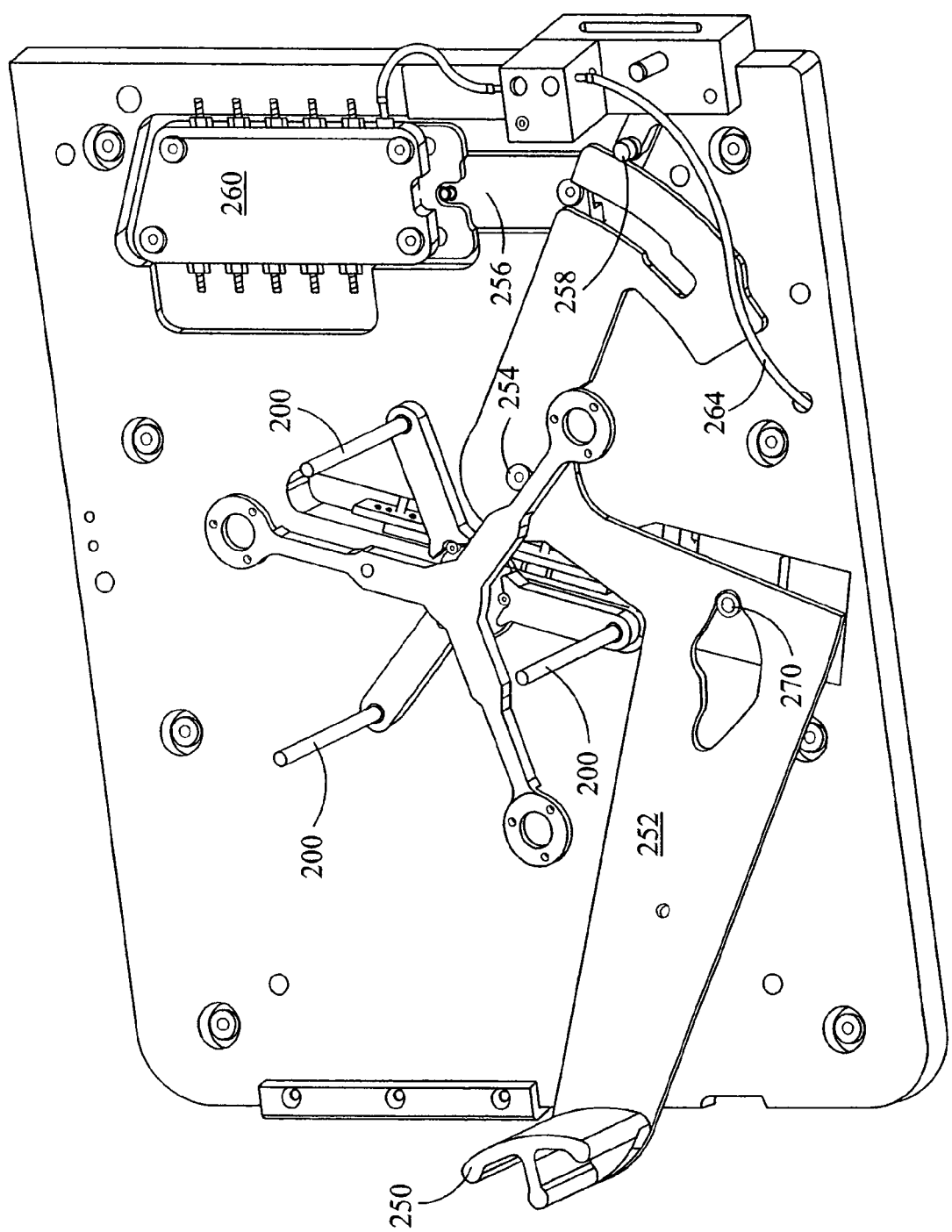
FIG. 12 illustrates a chuck with lift pins having a handle at 30 degrees.

Moving the handle of the lift mechanism from 30 degrees as illustrated in FIG. 12, to 12 degrees as illustrated in FIG. 11, rotates the lever 252 about the pivot point 254. A plate 256 when fully retracted (see FIG. 12) inhibits a vacuum from a vacuum switch 260 from being provided to openings 216 (see FIG. 8) in the upper surface 212 of the chuck 210 (hoses not shown). When the plate 256 is partially inserted within the vacuum switch 260 (see FIG. 11) as a result of the rotating lever 252 it causes a vacuum to be provided to the openings 216 in the upper surface of the chuck. In addition, while moving the lever 252 the lift pins 200 are preferably partially retracted. Accordingly, the partial retraction of the lift pins 200, and thus the lowering of the wafer toward the upper surface of the chuck, results in the activation of the vacuum switch 260.

Further retraction of the lift pins 200 by rotating the handle 250 of the lever to six degrees, as illustrated in FIG. 10, results in the disengagement of the roll out interlock 258 (locking mechanism). In this manner, the wafer is close to the upper surface of the chuck and is less likely to impact the probes if moved within the chamber. The lockout of the chuck may also be released when the lift pins are fully retracted or otherwise the wafer is supported by the upper surface of the chuck. Also, the release of the lockout mechanism while the lift pins 200 maintain the wafer above the upper surface of the chuck permits the chuck to be retracted within the chamber so that the wafer and upper surface of the chuck may both substantially reach the desired operating temperature.

Further retraction of the lift pins by rotating the handle of the lift mechanism to 0 degrees, as illustrated in FIG. 9, results in the wafer being supported by the upper surface of the chuck. The lift pins are typically recessed slightly below the upper surface of the chuck or otherwise substantially even with the upper surface of the chuck. Engaging the vacuum source prior to, or simultaneously therewith, the wafer coming into contact with the upper surface of the chuck reduces the likelihood that the wafer will skate or otherwise exhibit undesirable movement on the upper surface of the chuck.

The chuck may be retracted within the chamber with the wafer supported thereon for subsequent probing. While the chuck is retracted within the chamber, or otherwise not fully extended, the handle is locked out from being moved. The locking out of the handle and thus the lift pin mechanism reduces the likelihood that the handle will be inadvertently moved or otherwise the lift pins will be in pressing engagement with the wafer that is being secured by the vacuum on the upper surface of the chuck. Otherwise there would be a possibility for the user to inadvertently move the handle and thus drive the lift pins through the wafer itself, thus damaging part of the wafer.

The lockout of the lift pin mechanism is engaged when the chuck is sufficiently retracted or otherwise not fully extended, such as within the chamber. Also, the lockout of the lift pen mechanism is disengaged when the chuck is fully extended, or is otherwise at some point other than being fully retracted within the chamber for probing. Having the lockout mechanism engaged when the chuck is fully retracted reduces the likelihood of the user accidently causing the lift pins into pressing engagement with the wafer. Also, having the lockout mechanism engaged when the chuck is fully retracted reduces the likelihood of lifting the wafer off the upper surface of the chuck into the probes, and then reduces the likelihood of the chuck being in motion while the wafer is supported by the lift pins thus causing the wafer to slide off the lift pins within the chamber if the chuck is abruptly moved.

When the chuck is fully extended or otherwise sufficiently moved from its probing position, the lockout mechanism of the lift pins is disengaged. Referring again to FIG. 9, the handle 250 may be moved to lift the lift pins 200. The motion of the handle 250 moves a locking mechanism 258, which causes the stage to be locked in position, as illustrated in FIG. 10.

Sufficient rotation of the handle 250 and lever 252 causes the plate 256 to be retracted from vacuum switch 260 which turns off the vacuum to the upper surface of the chuck, as illustrated in FIG. 11. The mechanical motion of the handle 250 and lever 252 disengaging the vacuum switch 260 facilitates the wafer being lifted from the upper surface of the chuck. With the wafer securement mechanism being released, the wafer is more readily lifted by the lift pins 200.

After disengaging the vacuum to the upper surface of the chuck it turns out that there remains a residual vacuum suction between the upper surface of the chuck and the wafer which impedes lifting the wafer. To release the residual vacuum suction it was determined that a limited amount of air should be provided to the lower surface of the wafer. The additional air pressure is preferably provided through the vacuum lines to the chuck, but may be provided using different openings. The air pressure may be provided by the vacuum source. Preferably the air pressure is provided by expended air from a cylinder 272 that is used to raise and lower the lift pins through line 264, where the air pressure results from the movement of the lever 252. In this manner, the motion of the handle 250 and lever 252 causes the air pressure which helps to release the wafer from the upper surface of the chuck. Therefore, the air pressure will be provided to the upper surface of the chuck at the appropriate time and is not dependent upon whether the user moves the lever 252 quickly or slowly. One or more of the lockout features, and vacuum features may be omitted or otherwise performed in a different order.

Figure 13:
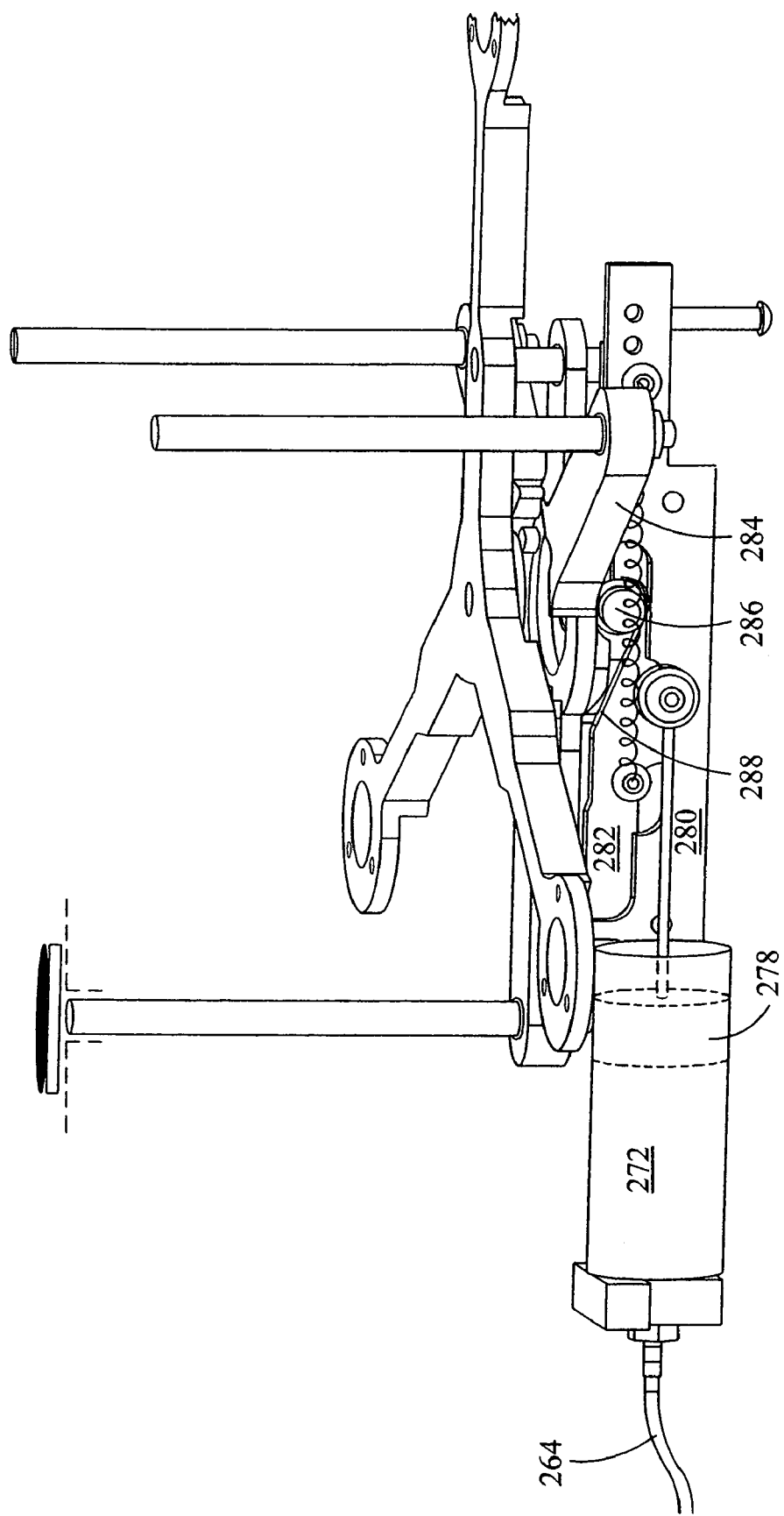
FIG. 13 illustrates a side view of the chuck with the lift pins retracted.
Figure 14:
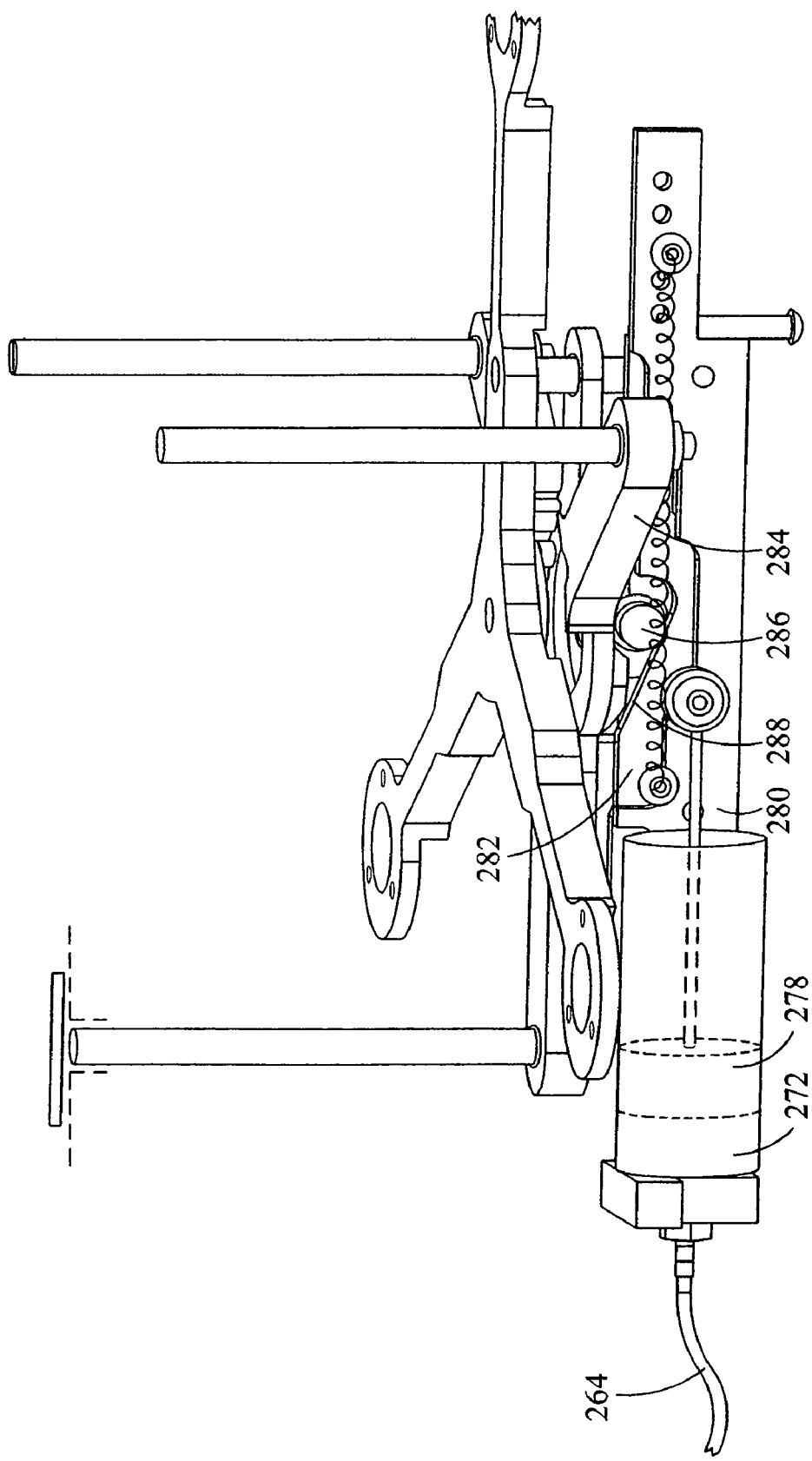
FIG. 14 illustrates a side view of the chuck prior to lifting the lift pins.

As previously noted, the movement of the handle 250 results in the shutting off the vacuum pressure to the wafer prior to raising the lift pins 200 above the upper surface of the chuck. As illustrated in FIGS. 9-12, the movement of the lever 252 moves a pin 270 inwardly which results in the movement of the outer portion of the air cylinder 272. Referring to FIG. 13 (lever at 0 degrees), the movement of the cylinder 272 causes a decrease in the region between a piston 278 and the end of the cylinder 272. Referring to FIG. 14, the piston 278 as a result of the increase in air pressure within the cylinder tends to move the drive plate 280 outwardly. The drive plate 280 is connected to a lift plate 282 by a resilient mechanism, namely a spring 284. As the drive plate 280 is moved, the lift plate 282 is likewise moved by the force applied by the spring 284. Movement of the lift plate 282 results in a bearing 286 of a lift pin assembly 284 being raised as the bearing 286 moves up a ramp 288. As it may be observed, if the wafer is stuck to the upper surface of the chuck by residual vacuum, the lift pin assembly 284 reduces its movement or otherwise is inhibited from movement by the resiliency of the spring 284. It is noted that during the movement of the cylinder 272 air is routed through air line 264 to provide air to the upper surface of the chuck to reduce residual vacuum. This linkage system provides some added benefits. One such benefit of the linage system is that the lift pin assembly 284 is not directly coupled to the lever 252 so that the applied force will not cause the lift pins 200 to break through the wafer. Another benefit of the linkage system is to provide a elastic mechanism that inhibits the ability of the lift pins 200 to break through the wafer. Yet another benefit of the linkage system is to inhibit the speed at which the lift pin assembly 284 may lift the lift pins by the action of the spring 284. Accordingly, the speed at which the lift pins are raised is not a direct relationship to the speed at which the lever 252 is moved.

Figure 15:
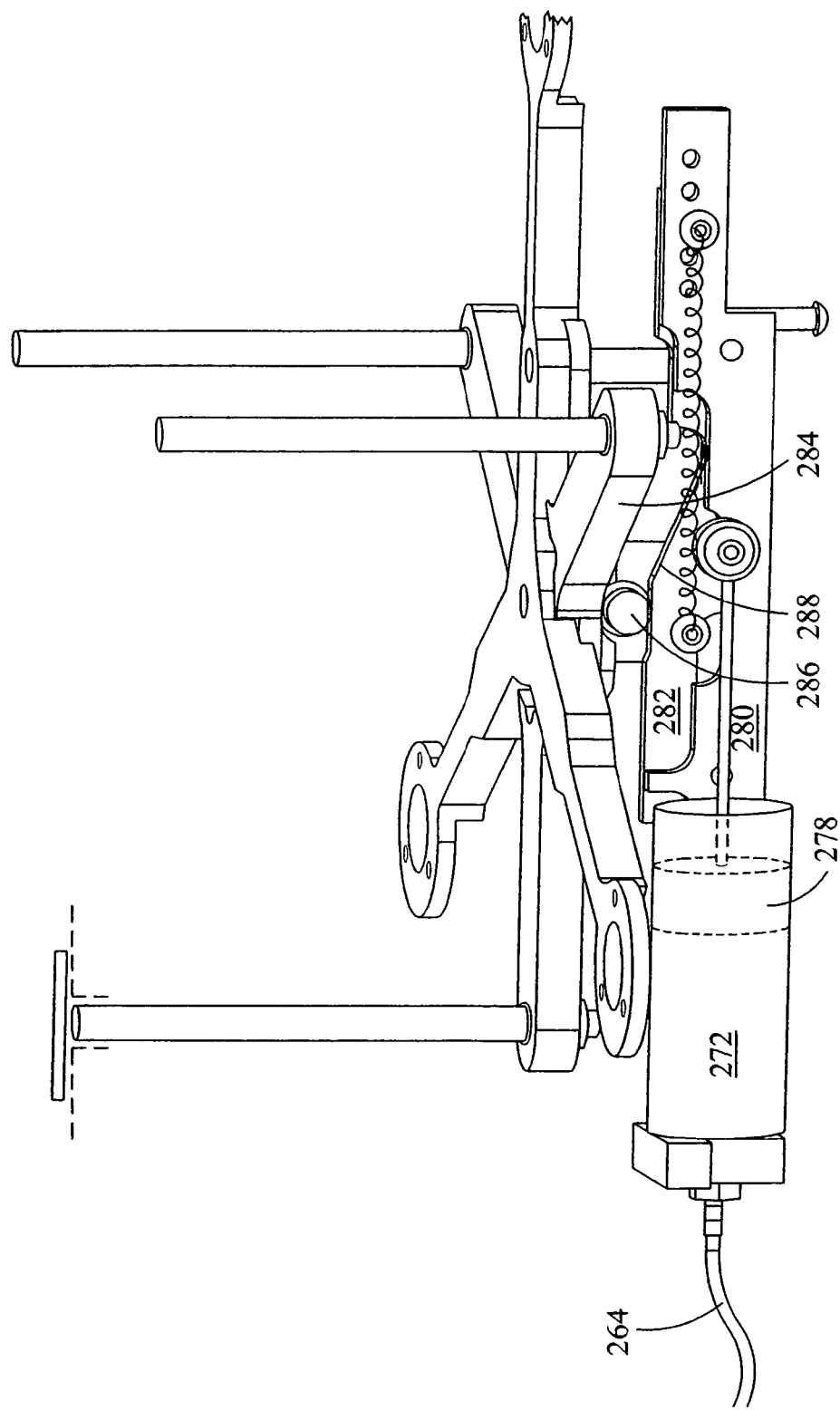
FIG. 15 illustrates a side view of the chuck with the lift pins raised.

Referring to FIG. 15, once the residual vacuum is relieved between the wafer and the upper surface of the chuck, the pressure exerted by the spring will tend to propel the lift plate assembly 282 upwardly, thus raising the wafer on the lift pins 200. Since the drive plate 280 is stationary when the lever 252 is fully rotated, the piston 278 moves in the cylinder 272 pulling in air. The chuck valve assembly routes air from the cylinder to the vacuum valve on the inward motion of the piston and provides makeup air via a needle valve as the piston pulls out. This controls the speed the pins lift once the suction is broken between the wafer and the chuck. The spring pulls the lift plate until its stop is against the drive plate.

It may be observed that the chuck preferably extends the portion supporting the wafer, while the stage which provides x, y, and z movements is not extended. In one embodiment, a set of one or more external pins or other member may extend upwardly above the upper surface of the chuck from the region surrounding a part of the upper surface of the chuck. The external pins inhibit the wafer from inadvertently sliding off the chuck. Preferably, the external pins extend above the height of the lift pins 200 when extended. In addition, the external pins preferably are raised prior to raising the lift pins and are preferably lowered after lowering the lift pins. In this manner, the external pins inhibit the possibility of the wafer from sliding off the lift pins or otherwise sliding off the upper surface of the chuck.

In some embodiments, the lift pins may be electrically interconnected to the same potential as the upper surface of the chuck. Alternatively, the lift pins may be electrically interconnected to the shield potential, the guard potential, the ground potential, or a floating potential. The lift pins may also include holes therein to which is selectively provided vacuum so that the wafer is more securely secured to the lift pins. The vacuum may be provided or released between any of the functions of the lift pin assembly.

The temperature of the chuck in thermal systems tends to vary between approximately −65 degrees Celsius and 300 degrees Celsius. When the thermal system undergoes cold conditions it is possible for ice crystals to form on the wafer under test. To inhibit the creation of ice crystals the chamber should (1) maintain the dew point of the air in the chamber below any surface temperature the air can contact; (2) introduce low velocity air across the probes, so as to avoid creating undesirable vibrations which could result in electrical noise; (3) transfer only a small amount of heat at the surface of the chuck to avoid the creation of significant temperature variations; (4) provide air to the chamber in a uniform manner to avoid non-uniform temperature variations; (5) limited heat transfer from the chuck to the air to facilitate rapid transition times between different measurements at different temperatures; and/or (6) transfer a small amount of heat at the walls of the microchamber, so as to avoid "sweating" of the outside of the microchamber under cold conditions, and to avoid creating a burning hazard under hot conditions.

The chamber preferably includes one or more inlets for air, such as through the top hat and/or inlets to the chamber, and includes one or more defined outlets for the air, such as through the top hat and/or inlets to the chamber. Typically the chamber includes a series of leakage paths to facilitate the exit of air. The system preferably includes in excess of 75%, more preferably 90%, of the air exiting the chamber to pass through the defined outlets. In this manner, the flow of air through the chamber may be more accurately controlled. In this manner, minor differences in the construction of one probe station to another probe station will have negligible impact on the resulting air flow.

The preferred air entry into the chamber includes a plurality of spaced apart ports. The air entry points include one above the chuck itself, such as within the top hat, and a port proximate to each of the upper corners of the chamber. The principal designated air exit is preferably in the central region of the side wall of the chamber, having a size of approximately 1.5 inches by 4.5 inches.

Figure 16:
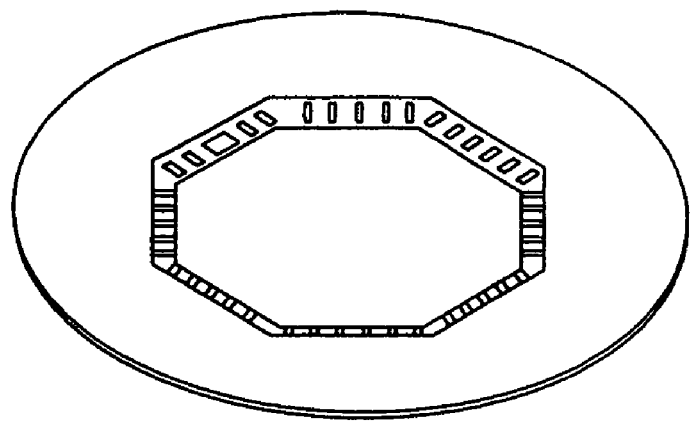
FIG. 16 illustrates a platen insert with even airflow.

Referring to FIG. 16, the air entry above the chuck is specifically designed to introduce the air through a platen insert in a low velocity, substantially laminar flow, having a radial component of velocity. The insert may include a pair of plates and baffles that substantially distribute air evenly around the platen insert. For example, the air may enter through three, four, five, six, or more openings. The intention is to provide the air drop smoothly through the opening in the platen onto the chuck where it smoothly distributes radially outward over the chuck. Another function of the air introduction involves air leakage through the top hat of the probe station. Under cold operating conditions, the chuck should produce a mild pumping action from the cold, heavier air flowing off the edges of the chuck. This flow of air should produce a slight vacuum in the center of the chuck that would tend to suck air through the top hat. Introducing air above the chuck helps assure that the pressure inside the top hat is always positive with respect to the pressure outside it. It has been determined that air flow between 8 and 12 cfh (0.13 to 0.2 cfm) is sufficient to reduce air leakage from the top hat and to provide a radial flow across the chuck having a velocity of a few millimeters per second at the outer edge.

Figure 17:
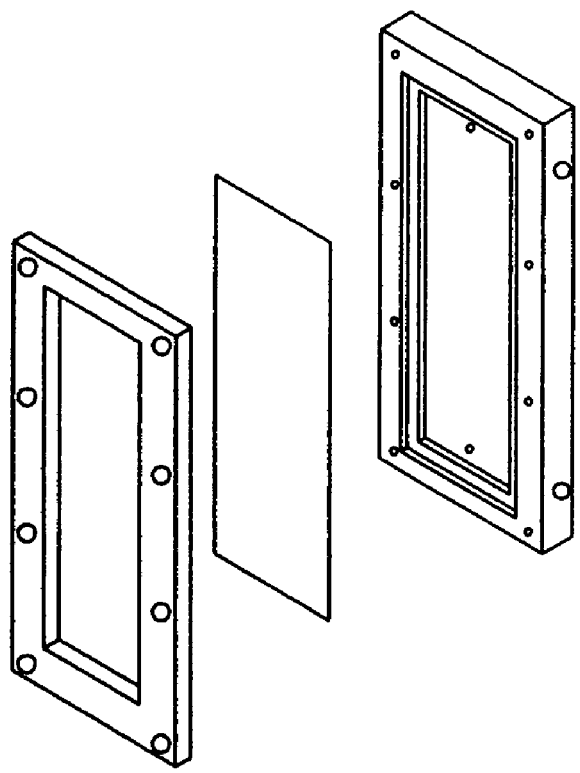
FIG. 17 illustrates an air port.

While simply an opening may be provided between the interior of the chamber and the exterior of the chamber, such an opening tends to be sub-optimal when making low current low noise measurements. Referring to FIG. 17, a more suitable port to the chamber includes a diffuser that includes a plate of porous sintered stainless steel (such as 5 micron pore size) sandwiched in a frame. The air pressure is preferably connected to the base (shown on the right) and passes into a plenum behind the porous plate before being substantially evenly distributed by passing through it.

The air exit from the chamber may include a purge vent. The vent may include a plurality of identical, convoluted air passages that are stacked upon one another. The purpose of the air passage is to provide a low pressure drop laminar airflow path that would attenuate the passage of light and low frequency electromagnetic waves. In this manner there is no straight path through the air exit from the interior to the exterior of the chamber.

It may be observed that a chamber may include air introduction above the wafer with a substantially sealed chamber together with controlled exhaust. However, the air introduced onto the wafer from the top hat works well when the chuck is generally centered under the opening in the platen. However, when the chuck is sufficiently displaced to the side with respect to the opening for the top hat, then the air flow will be sufficiently uneven because a portion of the air will not impact the chuck, but rather, will pass straight down (or with minor deviation) into the chamber.

Figure 18:
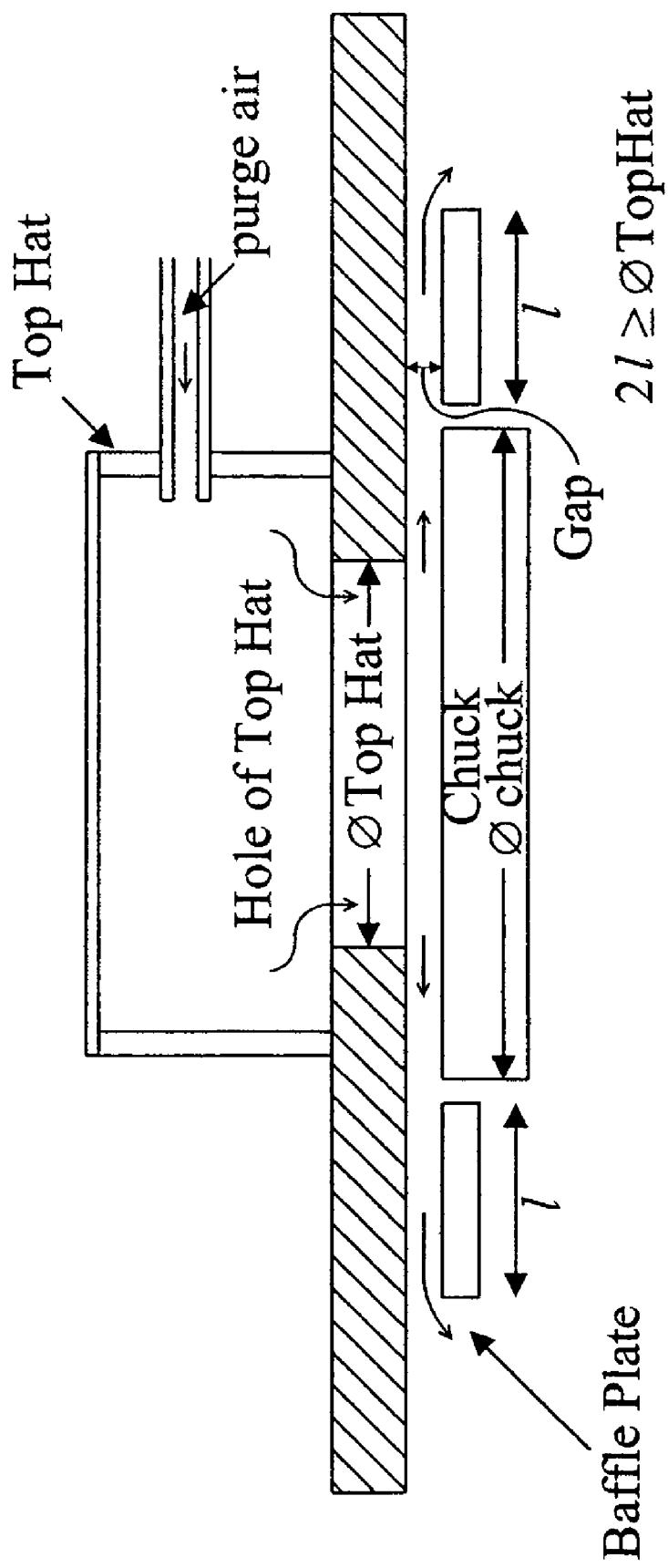
FIG. 18 illustrates a baffle around the chuck.

Referring to FIG. 18, to even out the air flow across the chuck when the chuck is sufficiently laterally displaced with respect to the opening in the top hat a baffle member may be included around at least a portion of the chuck, and more preferably around the majority, 75%, 95%, or 100% of the periphery of the chuck. The baffle member tends to act as an extension of the chuck and preferably has a sufficient width so that if the chuck is being probed at any particular edge, the baffle is still under all of the opening provided by the platen. For example, the width of the baffle may be the same as the opening in the platen. Further, there may be an opening around a majority of the chuck between the chuck and the baffle plate to provide for electrical isolation and an opening for the air to flow over the edge of the chuck.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probe station comprising:
   (a) a chamber that at least partially encloses a chuck assembly therein;
   (b) said chuck assembly having an upper surface thereon suitable to support a wafer thereon;
   (c) a plurality of members located within a periphery of said chuck assembly suitable to support said wafer;
   (d) said members moveable with respect to said upper surface so as to be capable of relative vertical movement with respect to said upper surface;
   (e) said chuck assembly movable from a location completely within said chamber to a location at least partially outside said chamber, a range of vertical movement of at least one of said members relative to said upper surface variable as a consequence of said position of said chuck relative to said chamber.

2. The probe station of claim 1 wherein said chamber is substantially airtight.

3. The probe station of claim 1 wherein said chuck includes a thermal unit to raise the temperature of said upper surface above ambient temperature.

4. The probe station of claim 1 wherein said chuck includes a thermal unit to lower the temperature of said upper surface below ambient temperature.

5. The probe station of claim 1 wherein said upper surface is substantially flat.

6. The probe station of claim 1 wherein said plurality of members are substantially evenly spaced around said chuck.

7. The probe station of claim 1 wherein said plurality of members are selectively raised or lowered.

8. The probe station of claim 1 wherein said plurality of members are capable of being maintained at different elevations above said upper surface.

9. The probe station of claim 1 wherein said plurality of members are movable in response to movement of a handle by a user.

10. A chuck assembly comprising:
    (a) said chuck assembly having an upper surface thereon suitable to support a wafer thereon;
    (b) a plurality of members located within the periphery of said chuck assembly suitable to support said wafer;
    (c) said members moveable with respect to said upper surface so as to be capable of relative vertical movement with respect to said upper surface;
    (d) said chuck assembly inhibited from lateral movement as a consequence of full extension of said plurality of members.

11. The chuck of claim 10 wherein said lateral movement is not inhibited when said plurality of members are fully retracted.

12. The chuck of claim 10 wherein said lateral movement is not inhibited when said plurality of members are not fully extended.

13. The chuck of claim 10 wherein vacuum is supplied to said upper surface of said chuck while said members are being retracted.

14. The chuck of claim 10 wherein vacuum is supplied to said upper surface of said chuck while said members are free from being extended above the upper surface of said chuck and said vacuum is reduced prior to extending said members above said upper surface of said chuck as a result of lifting said lift pins.

15. A chuck assembly comprising:
(a) said chuck assembly having an upper surface thereon suitable to support a wafer thereon;
(b) a plurality of members located within the periphery of said chuck assembly suitable to support said wafer;
(c) said members moveable with respect to said upper surface so as to be capable of relative vertical movement with respect to said upper surface;
(d) increasing a vacuum provided to said upper surface as a result of decreasing the extension of said plurality of members, where said plurality of members are not substantially even with said upper surface.

16. The chuck assembly of claim 15 wherein said decreasing said extension is from a point of full extension of said plurality of members to a point intermediate to said plurality of members being substantially even with said upper surface.

17. The chuck assembly of claim 15 wherein no vacuum is provided when said plurality of members are at said full extension.

18. A chuck assembly comprising:
(a) said chuck assembly having an upper surface thereon suitable to support a wafer thereon;
(b) a plurality of members located within the periphery of said chuck assembly suitable to support said wafer;
(c) said members moveable with respect to said upper surface so as to be capable of relative vertical movement with respect to said upper surface;
(d) said chuck assembly inhibited from lateral movement as a consequence of displacement of said plurality of members to a first height above said upper surface and freed from being inhibited as a consequence of displacement of said plurality of members to a second height above said upper surface, wherein said first height is greater than said second height.

19. A chuck assembly comprising:
(a) said chuck assembly having an upper surface thereon suitable to support a wafer thereon;
(b) a plurality of members located within the periphery of said chuck assembly suitable to support said wafer;
(c) said members moveable with respect to said upper surface so as to be capable of relative vertical movement with respect to said upper surface;
(d) said chuck assembly inhibited from relative movement of said members to a position above said upper surface when said chuck assembly is in a position suitable for probing said wafer.

* * * * *

UNITED STATES PATENT AND TRADEMARK OFFICE
CERTIFICATE OF CORRECTION

PATENT NO. : 7,362,115 B2
APPLICATION NO. : 11/655605
DATED : April 22, 2008
INVENTOR(S) : Peter Andrews et al.

Page 1 of 1

It is certified that error appears in the above-identified patent and that said Letters Patent is hereby corrected as shown below:

Col. 3, Line 4
Change "housing 18 a" to --housing 18a--.

Col. 9, Line 54
Change "of the linage" to --of the linkage--.

Signed and Sealed this

Twenty-sixth Day of May, 2009

JOHN DOLL
*Acting Director of the United States Patent and Trademark Office*